United States Patent [19]

Hashimoto et al.

[11] Patent Number: 5,674,368
[45] Date of Patent: Oct. 7, 1997

[54] FILM FORMING APPARATUS

[75] Inventors: Hajime Hashimoto; Kazuo Kubota; Daisuke Inoue; Syuichi Nogawa, all of Kyoto, Japan

[73] Assignee: Nissin Electric Co., Ltd., Kyoto, Japan

[21] Appl. No.: 250,500

[22] Filed: May 27, 1994

Related U.S. Application Data

[62] Division of Ser. No. 123,225, Sep. 20, 1993, Pat. No. 5,482,607.

Foreign Application Priority Data

| Sep. 21, 1992 | [JP] | Japan | 4-277795 |
| Nov. 11, 1992 | [JP] | Japan | 4-327340 |
| Nov. 26, 1992 | [JP] | Japan | 4-341143 |
| Nov. 26, 1992 | [JP] | Japan | 4-341144 |
| Feb. 9, 1993 | [JP] | Japan | 5-46003 |
| Apr. 8, 1993 | [JP] | Japan | 5-107562 |

[51] Int. Cl.⁶ .................. C23C 14/00; B65G 49/05
[52] U.S. Cl. .................. 204/298.25; 204/298.15; 414/217; 414/222; 118/719; 118/728
[58] Field of Search .................. 204/192.12, 298.15, 204/298.25, 298.26, 298.27; 414/217, 222; 118/719, 728, 729

[56] References Cited

U.S. PATENT DOCUMENTS

| 4,297,484 | 10/1981 | Mitomi | 204/298.35 |
| 4,388,034 | 6/1983 | Takahashi | 204/298.25 |
| 4,595,483 | 6/1986 | Mahler | 204/298.26 |
| 4,820,106 | 4/1989 | Walde et al. | 414/217 |
| 4,857,160 | 8/1989 | Landau et al. | 204/198.12 |
| 4,886,592 | 12/1989 | Anderle et al. | 204/298 |
| 5,019,233 | 5/1991 | Blake et al. | 204/298.25 |
| 5,061,356 | 10/1991 | Tanaka et al. | 204/298.26 |
| 5,180,718 | 1/1993 | Tepman et al. | 29/25.01 |
| 5,186,594 | 2/1993 | Toshima et al. | 204/298.25 |
| 5,217,501 | 6/1993 | Fuse et al. | 118/719 |
| 5,223,001 | 6/1993 | Saeki | 204/298.25 |
| 5,344,542 | 9/1994 | Mahler et al. | 204/298.25 X |
| 5,417,537 | 5/1995 | Miller | 204/298.25 X |
| 5,435,682 | 7/1995 | Crabb et al. | 204/298.25 X |

FOREIGN PATENT DOCUMENTS

| 0136562A2 | 8/1984 | European Pat. Off. |
| 0161928A2 | 5/1985 | European Pat. Off. |
| 0262861A2 | 9/1987 | European Pat. Off. |
| 0354294A2 | 1/1989 | European Pat. Off. |

*Primary Examiner*—Nam Nguyen
*Attorney, Agent, or Firm*—Finnegan, Henderson, Farabow, Garrett & Dunner, L.L.P.

[57] ABSTRACT

A film forming apparatus includes a film forming chamber in which a film is formed on a substrate at a film forming position, a plurality of load lock chambers provided on the film forming chamber through gate valves respectively, a plurality of pivots provided in the film forming chamber correspondingly to the respective load lock chambers, and carrying arms supported by the pivots respectively so as to move the substrate from any one of the load lock chambers to the film forming position and contrariwise from the film forming position to any one of the load lock chambers.

1 Claim, 15 Drawing Sheets

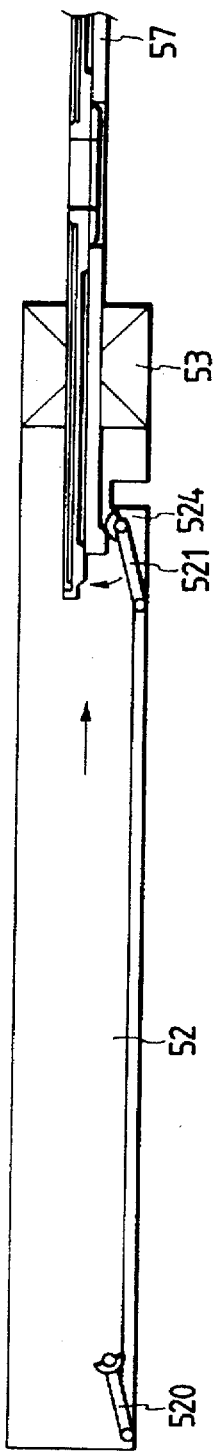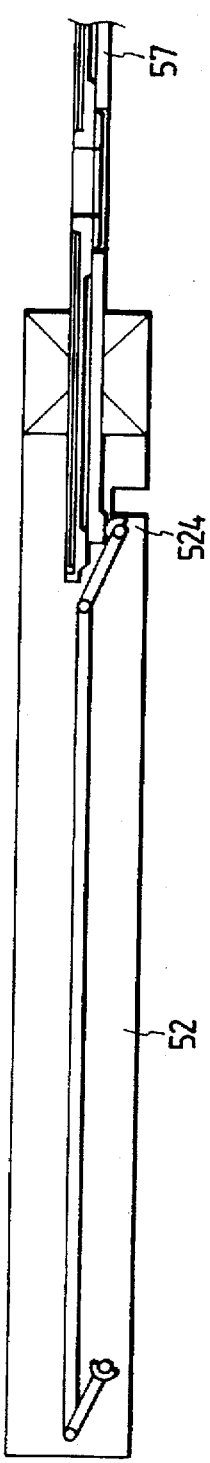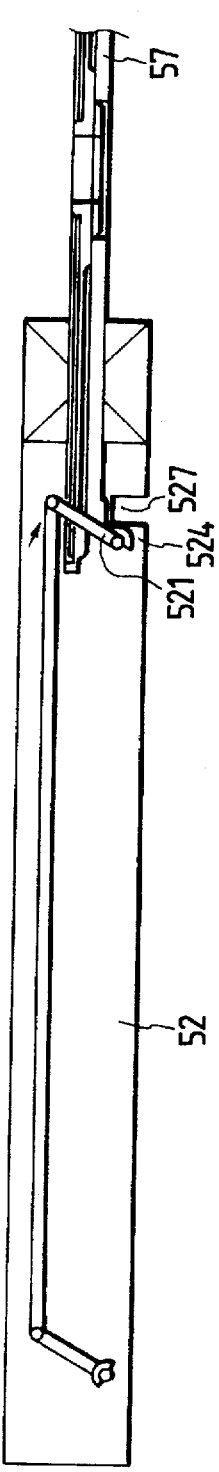

FILM FORMING APPARATUS

This is a division of application Ser. No. 08/123,225, filed Sep. 20, 1993 now U.S. Pat. No. 5,482,607.

BACKGROUND OF THE INVENTION

The present invention relates to a film forming apparatus such as an ion-beam sputtering apparatus in which a device of holding a substrate such as a disk in a film forming chamber and a device of delivering a substrate are improved, the quantity of treatment per unit time (throughput) is improved, an outside line of carrying a substrate is simplified, and the deposition of film in a load lock chamber is prevented.

A conventional film forming apparatus is configured as shown in FIG. 1 which is a schematic plan view of the apparatus. In this drawing, reference numeral 41 designates a film forming chamber in which a film is formed on a disk 43 located at a film forming position 42; 44, two load lock chambers provided with their one sides disposed adjacent to the film forming chamber 41 through inner square gate valves 45; 46, outer square gate valves provided on the other sides of the respective load lock chambers 44; 47, pivots uprightly provided in the respective load lock chambers 44; 48, carrying arms supported by the respective pivots 47; and 49, an exchange position at which a disk 43 is mounted or demounted.

With respect to one of the load lock chambers 44, the outer gate valve 46 is opened, the forward end portion of the carrying arm 48 is moved into to the exchange position 49, a disk 43 is set to the forward end portion, the disk is carried into the load lock chamber 44, the outer gate valve 46 is closed, and the load lock chamber 44 is exhausted into a vacuum state. Then, the inner gate valve 45 is opened, and the disk 43 is carried into the film forming position 42 to perform film formation.

In this duration, with respect to the other one of the load lock chambers 44, another disk 43 before subjected to film formation is carried into the other load lock chamber 44 in the same manner as described above, and the load lock chamber 44 is exhausted into a vacuum state.

After completion of the above-mentioned film formation, the former disk 43 is returned into the one load lock chamber 44, the inner gate valve 45 is closed, the outer gate valve 46 is opened, the disk 43 is returned into the exchange position 49, the disk 43 after subjected to film formation is taken out, and another disk 43 before subjected to film formation is set.

In this duration, the disk 43 in the other load lock chamber 44 is being subjected to film formation in the film forming position 42. The above-mentioned procedure is repeated so that disks are subjected to film formation successively.

In the case of the conventional film forming apparatus, the pivots 47 of the carrying arms 48 are provided in the load lock chambers 44 respectively. Accordingly, the volume of each of the load lock chambers 44 becomes large, so that vacuum exhausting time becomes long. Thus, there arises a problem that the quantity of treatment per unit time is reduced. Further, since the inner gate valve 45 is kept opened in the duration of film formation, there arises another problem that film may be deposited on a seal surface of the inner gate valve 45 and an inner surface of the load lock chamber 44.

A conventional substrate holding device of a film forming chamber of a conventional film forming apparatus is configured as shown in FIGS. 2 and 3. In the drawings, reference numeral 31 designates an up/down movable hollow main shaft; 32, a hollow arm shaft rotatably supported in the inside of the main shaft 31 through a bearing 33; 34, a drive shaft rotatably supported in the inside of the arm shaft 32 through a bearing 35; 36, a carrying arm formed integrally with the arm shaft 32 at an upper end thereof so as to extend in the horizontal direction; 37, a rotating shaft rotatably supported on an end of the arm 36 through a bearing 38; 39, a deposition preventing plate integrally formed with an upper end of the rotating shaft 37; and 310, a substrate such as a disk mounted on the deposition preventing plate 39.

Reference numeral 311 designates a small pulley fixed on an upper end of the drive shaft 34; 312, a large pulley fixed to a peripheral surface of the rotating shaft 37; 313, a belt wound around both the pulleys 311 and 312; 314, holders provided radially at a central portion of the rotating shaft 37 and rotatably supported at their central portions by pivots 315 respectively; 316, springs for inward urging the lower portions of the respective holders 314; and 317, holding pawls projectingly provided at the upper outside portions the respective holders 314 so as to push the inner circumferential edge portions of the substrate 310.

Reference numeral 318 designates a rotary shaft; 319, a support rod formed integrally with the rotary shaft 318 so as to obliquely extend from the lower end of the rotary shaft 318; and 320, a mask fixed on the forward end of the support rod 319 for covering the holders 314 so as to prevent a film from adhering onto the holders 314. Reference numeral 321 designates a cooling water path formed so as to communicate with the arm shaft 32 and the arm 36 for absorbing heat due to sputtering particles.

Next, the operation will be described. In a load lock chamber, the respective lower portions of the holders 314 are urged outward against the spring 316, the substrate 310 is mounted on the deposition preventing plate 39, and the above-mentioned urging is released so that the substrate 310 is held by the holding pawls 317. Then, the carrying arm 36 is rotated by means of the arm shaft 32 so as to carry the substrate 310 into the film forming position. The main shaft 31, the arm shaft 32, the drive shaft 34, and the like are pushed up so that the holding pawls 314 are disposed below the mask 320. The substrate 310 is rotated by rotation of the drive shaft 44 through the small pulley 311, the belt 313, the large pulley 312, the rotating shaft 37, and the deposition preventing plate 39, so that film formation is performed.

After completion of film formation, the substrate 310 is carried into the load lock chamber in the reverse process to the foregoing one.

In the foregoing conventional holding device, there have been various problems as follows.

(1) The main shaft 31, the arm shaft 32, and the drive shaft 34 constitute a triple shaft structure and therefore the rotation and airtight mechanisms are complicated.

(2) The belt 313 is disposed above the carrying arm 36 so that the thickness is large, and a gate valve of the load lock chamber is required to have a large opening so that the cost becomes high. Further, the volume of the load lock chamber becomes large so that the vacuum exhaust time becomes long.

(3) It is necessary that the deposition preventing plate 39 is subject to frequent maintenance because it is a member on which the quantity of film deposition is largest. The deposition preventing plate 39, however, is required to be disassembled together with the rotating shaft 37 because the former is formed integrally with the latter, so that the disassembling work is troublesome.

(4) Further, in the case of a PMMA disk to be used as a laser disk, the radial structure has a directional property and the central portion of the disk is pressed by means of the radial holding pawls 317, so that the disk is apt to be broken.

(5) In the case of provision of a plurality of load lock chambers and carrying arms 36, it is necessary to use complicated triple shaft structure of the same number as that of the carrying arms 36.

FIG. 4 shows a conventional delivering device of a film forming substrate of a conventional film forming apparatus, by which a substrate to be subjected to film formation is delivered in a load lock chamber to a carrying arm. In this drawing, reference numeral 51 designates a film forming chamber in which film formation is performed; 52, a load lock chamber provided at one side of the film forming chamber 51 through a gate valve 53; 54, a pivot led into the film forming chamber 51 through a magnetic fluid seal 55; 56, an arm servomotor for rotating the pivot 54; 57, a carrying arm fixed to an upper end portion of the pivot 54; and 58, a C-shaped support portion formed at a forward end portion of the carrying arm 57 so as to move between a delivery position of the load lock chamber 52 and the film forming chamber 51 through the pivot 54 and the carrying arm 57 by rotation of the arm servomotor 56.

Reference numeral 59 designates a ball screw rotated by a servomotor 510 for up/down movement; 511, an up/down moving plate thread-engaged with the ball screw 59 so as to be moved up/down by the rotation of the ball screw 59; 512, an up/down moving shaft planted on the up/down moving plate 511 and led into the load lock chamber 52; 513, a tray mount fixed to an upper end of the up/down moving shaft 512 and provided in the load lock chamber 52; 514, bellows provided between the up/down moving plate 511 and the load lock chamber 52 so as to surround a base portion of the up/down moving shaft 512; 515, a tray mounting a substrate 516 thereon and mounted on the mount 513; and 517, a cover of the load lock chamber 52.

The movement of the substrate 516 will be described below.

First, the cover 517 of the load lock chamber 52 is opened in the condition in which the gate valve 53 is closed, the substrate 516 is mounted on the tray mount 513 located above, and the cover 517 is closed so that vacuum exhaustion is performed. Then, the gate valve 53 is opened, the arm servomotor 56 is rotated so that the support portion 58 of the carrying arm 57 is led into the delivery position of the load lock chamber 52. In the tray mount 513, an opening is formed to make it possible to move the carrying arm 57. In this condition, the up/down moving servomotor 510 is driven so that the tray 515 is moved down through the ball screw 59, the up/down moving plate 511, the up/down moving shaft 512 and the tray mount 513 so as to be mounted on the support portion 58.

Then, the carrying arm 57 is rotated reversely by the reverse rotation of the arm servomotor 56, so that the support portion 58 moves into the film forming chamber 51.

In the case of the conventional delivering device, the servomotors 56 and 510 are used for rotating the carrying arm 57 and for up/down moving the tray mount 513, respectively. Accordingly, not only the cost is high because of use of the two motors 56 and 510 but the control is complex because it is necessary to link the respective operations of the two motors 56 and 510 with each other.

Further, because the bellows 514 is used for up/down moving, the inner surface area of the load lock chamber becomes large. Accordingly, a long tome is required for exhaustion up to a high vacuum region.

Furthermore, there are many airtight points in the up/down moving operation portion. Thus, there arises a problem that maintenance such as periodic exchange of the seal material and the bellows 514 is required.

FIG. 5 shows still another film forming apparatus to form a thin film such as an aluminum thin film. In the drawing, reference numeral 21 designates a film forming chamber in which a thin film of, for example, aluminum is formed onto a substrate 22; 23, a load lock chamber provided through an inside gate valve 24; 25, an outside gate valve provided outside the load lock chamber 23; 26, a turbo molecular pump provided in the load lock chamber 23 through a pump-side gate valve 27; 28, a rotary pump connected to the turbo molecular pump 26 through a pump-side valve 29; and 210, a carrying arm.

The outside gate valve 25 is opened so that the substrate 22 is mounted on the arm 210, the valve 25 is closed, and the load lock chamber 23 is exhausted by means of the rotary pump 28 and further exhausted into high vacuum by means of the turbo molecular pump 26. On the other hand, the film forming chamber 21 has been exhausted into high vacuum by means of the turbo molecular pump in advance. In the state where the degree of vacuum of the load lock chamber 23 has reached the same value as that of the film forming chamber 21, the inside gate valve 24 is opened, the substrate 22 is carried into the film forming chamber 21 by means of the arm 210, and the valve 24 is closed so that film formation is performed.

After completion of film formation, the inside gate valve 24 is opened, the substrate 22 is carried into the load lock chamber 23, the valve 24 is closed, the outside gate valve 25 is opened, the substrate 22 is discharged, another substrate 22 which is to be subjected to film formation next is carried into the load lock chamber 23, the outside gate valve 25 is closed, the load lock chamber 23 is exhausted by means of the rotary pump 28 and the turbo molecular pump 26, and the foregoing film forming operation is repeated.

Experimentation was carried out to form thin films of aluminum on substrates to obtain a stable high reflection factor. Such a result as shown in FIG. 6 was obtained when the rate of film formation was 3000 Å/min. That is, in order to obtain a reflection factor not lower than 82.5%, it is necessary to make the film forming chamber be high vacuum not lower than $6 \times 10^{-5}$ Torr.

There is a problem in that although it is possible to exhaust the film forming chamber 21 of FIG. 5 into high vacuum of $1 \times 10^{-7}$ Torr because exhaust is performed by using the turbo molecular pump, it is necessary to keep the load lock chamber 23 in high vacuum so that the state of vacuum of the film forming chamber 21 does not become lower than the above value of $6 \times 10^{-5}$ Torr when the inside gate valve 24 is opened, and it is therefore necessary to use not only the rotary pump 28 but also the expensive turbo molecular pump 26, so that the equipment cost becomes extremely expensive.

SUMMARY OF THE INVENTION

In view of the, an object of the present invention is to provide a film forming apparatus in which the quantity of treatment per unit time is increased while the deposition of film onto seal surfaces of gate valves and inner surfaces of load lock chambers is prevented.

Another object of the present invention is to provide a film forming apparatus in which a substrate holding device of a film forming chamber has features that the configuration of carrying arm shafts is simplified, the carrying arm is made thin, and a deposition preventing plate is attachable to and removable from the carrying arm to make the maintenance therefor easy.

Still another object of the present invention is to provide a film forming apparatus in which not only configuration is simplified without use of any expensive servomotor but vacuum exhausting time is shortened to thereby attain great reduction in cost.

Still another object of the present invention is to provide a film forming apparatus in which a substrate supporting device has pressing bodies for pressing an upper surface of a substrate, which are configured so as not to be supported by support arms located above a substrate so that reduction of the rate of film formation as well as bad influence onto the quality and thickness distribution of the film due to film deposition to the support arms can be prevented from occurring.

Still another object of the present invention is to provide a film forming apparatus in which the exposure time for vessels such as load lock chambers to the atmosphere is shortened and the vacuum exhausting time is shortened to thereby increase the quantity of treatment per unit time, in which the configuration of an outside substrate carrying line is simplified, and in which the number of the carrying arms is decreased to thereby make the cost low.

Still another object of the present invention is to provide a film forming apparatus in which any expensive pump is not used in a load lock chamber so that the equipment cost is inexpensive.

To solve the above-mentioned problems, the film forming apparatus according to a first aspect of the present invention comprises a film forming chamber in which a film is formed on a substrate such as a disk located at a film forming position, a plurality of load lock chambers provided on the film forming chamber through gate valves respectively, a plurality of pivots provided in the film forming chamber respectively correspondingly to the load lock chambers, and carrying arms supported by the pivots respectively and for moving the substrate from any one of the load lock chambers to the film forming position and contrariwise from the film forming position to any one of the load lock chambers.

In the thus configured film forming apparatus of the present invention, the pivots of the carrying arms are not provided in the load lock chambers but provided in the film forming chamber correspondingly to the respective load lock chambers. Accordingly, the volume of each of the load lock chambers is reduced, so that vacuum exhausting time is shortened. As a result, the quantity of treatment per unit time is increased. Further, in the duration of film formation, the gate valve between the film forming chamber and each of the load lock chambers can be kept closed, so that the film deposition onto seal surfaces of the gate valves and inner surfaces of the load lock chambers can be prevented.

According to a second aspect of the present invention, a substrate holding device of a film forming chamber of a film forming apparatus comprises: a deposition preventing plate for mounting a substrate thereon, the plate being removably supported on an end of a carrying arm; a rotatable push-up means made to abut on a central portion of a lower surface of the deposition preventing plate so as to push up the deposition preventing plate; and a rotatable support made to abut on a central portion of the substrate on an upper surface of the deposition preventing plate pushed up by the push-up means so that the deposition preventing plate and the substrate are sandwiched between the rotatable support and the push-up means.

In the thus configured substrate holding device of a film forming chamber according to the present invention, the deposition preventing plate is removably supported on an end of the carrying arm, a substrate mounted on the deposition preventing plate is pushed up by the push-up means together with the deposition preventing plate, and the thus pushed-up deposition preventing plate and the substrate are sandwiched between the rotatable push-up means and the support. Accordingly, the configuration of the carrying-arm rotary shaft is simplified because the rotary shaft is constituted by one shaft, the carrying arm is made thin because it supports only the substrate, and the maintenance of the deposition preventing plate becomes easy because it is removable from the carrying arm. Further, since the upper surface of a substrate can be uniformly pressed by means of the support, the substrate can be prevented from being broken, and even when the number of the carrying arms increases, it is sufficient to provide only one push-up means for rotating a substrate.

According to a third aspect of the present invention, a device for delivering a substrate to be subjected to film formation in a film forming apparatus comprises: a rotatable front shaft and a rotatable rear shaft which are provided in parallel in a horizontal plane; a front link and a rear link which are fixed to the two shafts so as to be perpendicular to the two shafts respectively; a mount for mounting a tray of the substrate to be subjected to film formation, the mount being connected to the respective top end portions of the two links and located in a horizontal plane; a front roller and a rear roller which are substantially semicircular and fixed to the two shafts respectively and which have lack portions displaced in position from each other; a holder for holding the mount at a position above the shafts; a carrying arm having a tray support portion provided at its forward end portion so that the tray support portion goes in and out of a portion above the two shafts; and an engagement body projectingly provided at a lower surface of a forward end of the carrying arm so as to engage with the two rollers to thereby rotate the two rollers.

In the thus configured device for delivering a substrate to be subjected to film formation, the mount of the tray of the substrate to be subjected to film formation is supported by a link mechanism and the engagement body of the carrying arm engages with the substantially semicircular front and rear rollers provided in the front and rear of the link mechanism respectively and having lack portions displaced from each other. Thus, when the tray support portion at the forward end portion of the carrying arm moves ahead into the link mechanism, the engagement body engages with the front roller so that the mount in an upper position moves down to thereby mount the tray on the support portion. When the support portion contrariwise moves back, the engagement body engages with the rear roller so that the mount moves up to thereby return the mount to its original upper position.

According to a fourth aspect of the present invention, a substrate supporting device of a film forming apparatus comprises an up/down movable rotating shaft, an receptor formed on an upper end circumferential surface of the rotating shaft for mounting thereon a lower surface of a rim portion of a central hole of a substrate, and pressing bodies provided on an upper end of the rotating shaft so as to be capable of being expanded-opened and contracted-closed for pressing an upper surface of the rim portion of the substrate mounted on the receptor.

In the thus configured substrate supporting device of a film forming apparatus, the pressing bodies for pressing the upper surface of the rim portion of the central hole of a substrate mounted on the receptor of the rotating shaft are provided on the upper end of the rotating shaft so as to be capable of being expanded-opened and contracted-closed. Therefore, differing from the conventional device, each of the support arms for supporting the pressing body does not exist at the film forming surface side of the substrate, there is nothing to prevent film formation on the substrate, and there is no abrasion portions due to positioning, so that it is possible to prevent reduction of the rate of film formation as well as bad influence on the quality and thickness distribution of the film.

According to a fifth aspect of the present invention, the film forming apparatus comprises: a film forming chamber in which a film is formed onto a substrate such as a disk at a film forming position; a take-in chamber provided on the film forming chamber through a gate valve for exclusively taking the substrate into the film forming chamber; a take-out chamber provided on the film forming chamber through another gate valve for exclusively taking the substrtae out of the film forming chamber; a pivot provided in the film forming chamber; and a carrying arm rotatably supported by the pivot for carrying the substrate from the take-in chamber into the film forming position and for carrying the substrate after subjected to film formation from the film forming chamber into the take-out chamber.

In the thus configured film forming apparatus, since the take-in chamber for exclusively taking in a substrate before subjected to film formation and the take-out chamber for exclusively taking out the substrate after subjected to film formation are provided separately from each other, the time for which the chambers are exposed to the atmosphere is substantially halved in comparison with the conventional example so that the time for vacuum exhaustion is reduced to thereby increase the quantity of treatment per unit time. Further, the configuration of an outside substrate carrying line is simplified because the substrate take-in and take-out portions are separated from each other, and since a substrate is carried into the take-in chamber, the film forming chamber, and the take-out chamber by means of only one carrying arm, the number of the arms is halved in comparison with the conventional example and the cost is reduced.

According to a sixth aspect of the present invention, the film forming apparatus comprises a film forming chamber in which a film is formed onto a substrate, and a load lock chamber provided on the film forming chamber through a gate valve for sending the substrate into the film forming chamber, wherein when a volume of the film forming chamber is V1, a reachable degree of vacuum in the film forming chamber is P1, a required degree of vacuum at film formation is P, a volume of the load lock chamber is V2, and a reachable degree of vacuum in the load lock chamber is P2, the relation between the volume V1 and V2 satisfies the following expression:

$$V1/V2 \geq (P2-P)/(P-P1).$$

In the thus configured film forming apparatus, the relation between the respective volumes of the film forming chamber and the load lock chamber is limited from the respective reachable degrees of vacuum in both the chambers as well as the required degree of vacuum in the film forming chamber, and the volume of the load lock chamber is made small. In order to exhaust the load lock chamber into vacuum, therefore,.it is not necessary to use any expensive turbo molecular pump or the like but only an inexpensive rotary pump may be used. The equipment cost is therefore made inexpensive.

BRIEF DESCRIPTION OF THE DRAWINGS

FIGS. 18A to 18C are views for explaning the operation of a rear half of FIG. 14;

DETAILED DESCRIPTION OF THE INVENTION

Preferred embodiments of the present invention will be described with reference to the accompanying drawings.

Figure 1:
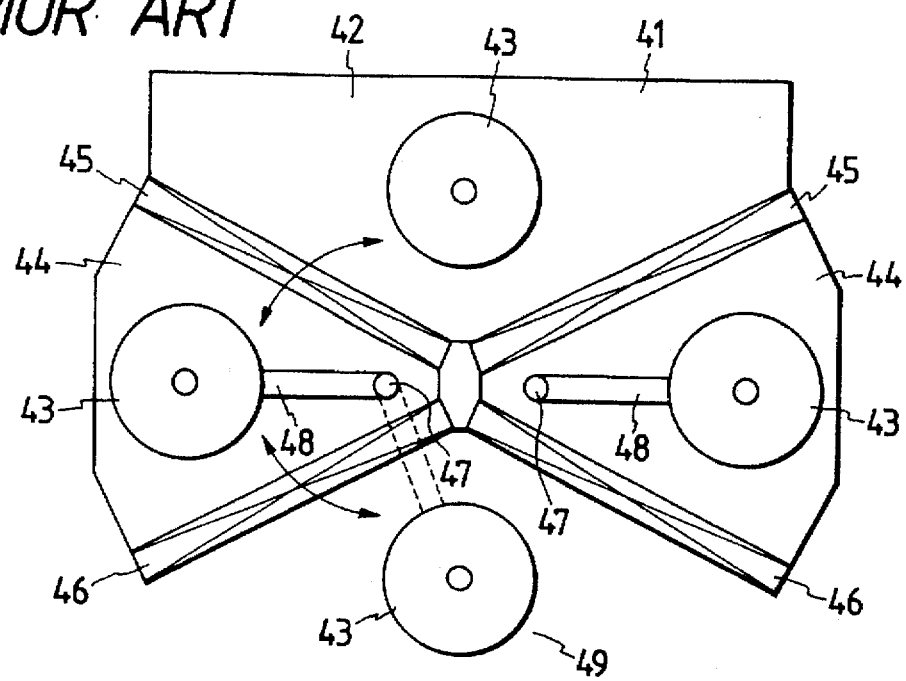
FIG. 1 is a schematic plan view of a conventional apparatus.
Figure 2:
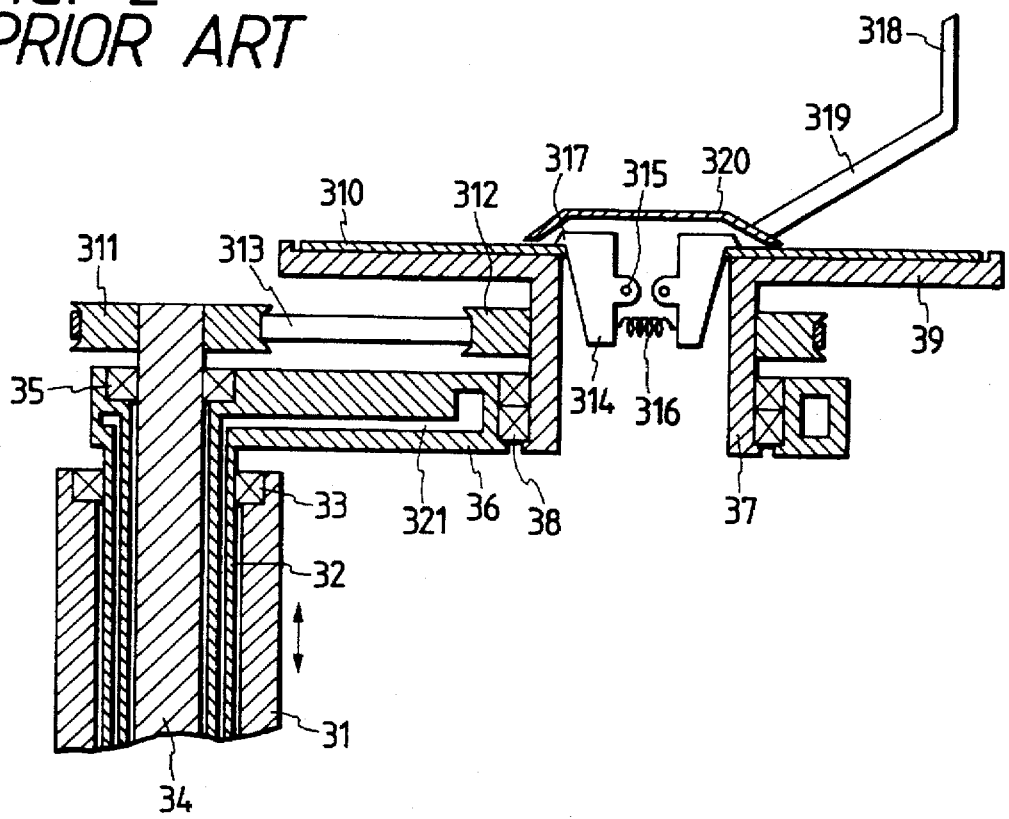
FIG. 2 is a sectional front view showing another conventional apparatus.
Figure 3:
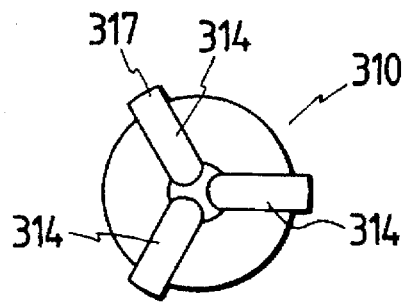
FIG. 3 is a plan view showing a part of FIG. 2.

FIGS. 7 through 12 show a first embodiment of the present invention. In the drawings, the same reference numerals as those in FIG. 1 represent the same or corresponding parts. FIGS. 7 through 10, which show the general configuration thereof, will be described first.

Reference numeral 410 designates a plurality of load lock chambers provided on a film forming chamber 41 through square gate valves 411 respectively; 412, a plurality of pivots provided in the film forming chamber 41 correspondingly to the respective load lock chambers 410; and 413, carrying arms supported by the pivots 412 respectively and for moving a disk (substrate) 43 before subjected to film formation from any one of the load lock chambers 410 to a film forming position 42 in the film forming chamber 41 and contrariwise moving a disk (substrate) 43 after subjected to film formation from the film forming position 42 into any one of the load lock chambers 410.

Reference numeral 414 designates a sputtering ion source; 415, a target provided in the film forming chamber 41 so as to be irradiated with ion beam 416 from the ion source 414; 417, a disk holder provided at the film forming position 42 so as to hold and rotate the disk 43 which is moved by one of the carrying arms 413; 418, a mount of the film forming chamber 41; and 419, covers of the load lock chambers 410 respectively.

The cover 419 of a certain load lock chamber 410 is opened, a disk 43 before subjected to film formation is set in the load lock chamber 410, the cover 419 is closed, and the load lock chamber 410 is exhausted into a vacuum state. Then, the gate valve 411 is opened, the carrying arm 413 in its standby position 420 is moved into the load lock chamber 410 to support the disk 43 so that it moves the disk 43 into the film forming position 42, the gate valve 411 is closed, the disk holder 417 is made to push up the disk 43 to hold the disk 43, the arm 413 is retracted from the film forming position 42 into the standby position 420, and the holder 417 is rotated so that film formation is carried out.

In this duration, a next load lock chamber 410 is exhausted into a vacuum state after a disk 43 before subjected to film formation is set therein.

After completion of film formation, the arm 413 is moved into the film forming position 42, the holder 417 is moved down so as to deliver the disk 43 to the arm 413, the gate valve 411 is opened, the disk 43 is carried into the load lock chamber 410, the arm 413 is returned to the standby position 420, and the gate valve 411 is closed. Then, the cover 419 is opened, the disk 43 after subjected to film formation is taken out, a next disk 43 before subjected to film formation is set in the load lock chamber, and the load lock chamber is exhausted into a vacuum state.

In this duration, a disk 43 in a load lock chamber 410 next to the above-mentioned load lock chamber is carried to the film forming position so as to be subjected to film formation in the same manner as described above.

In this duration, a disk 43 before subjected to film formation is set in a further next load lock chamber 410 and the load lock chamber 410 is exhausted into a vacuum state in the same manner as described above.

In this manner, setting of a disk 43 before subjected to film formation, film formation onto the disk, and take-out of the disk 43 after subjected to film formation are repeated successively. As a result, film formation can be performed continuously at the film forming position 42.

Figure 11:
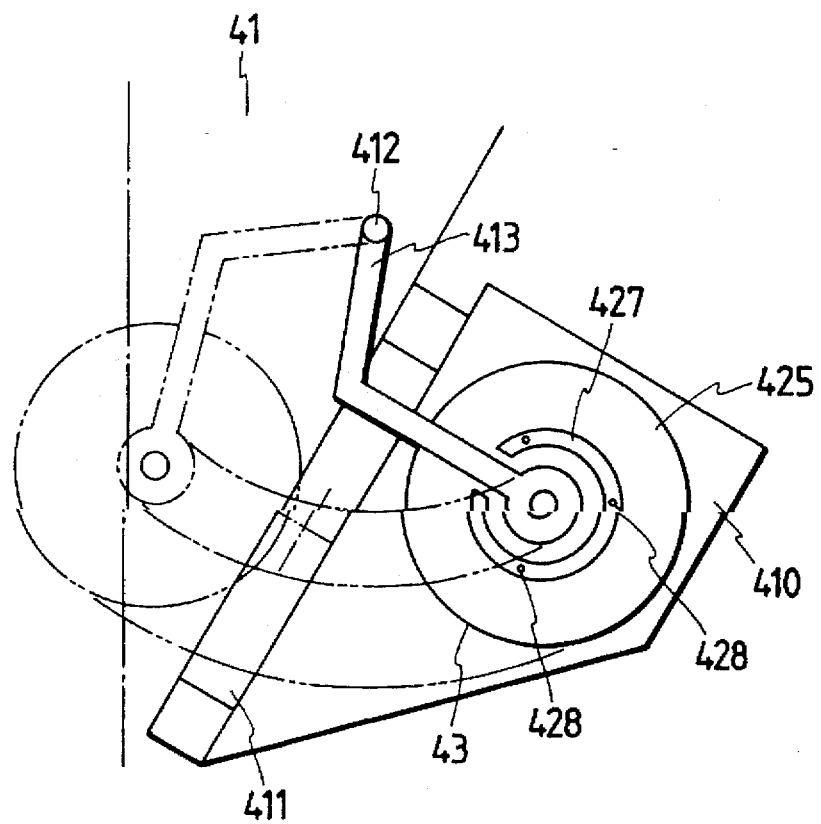
FIG. 11 is a schematic plan view of a part of FIG. 7.
Figure 12:
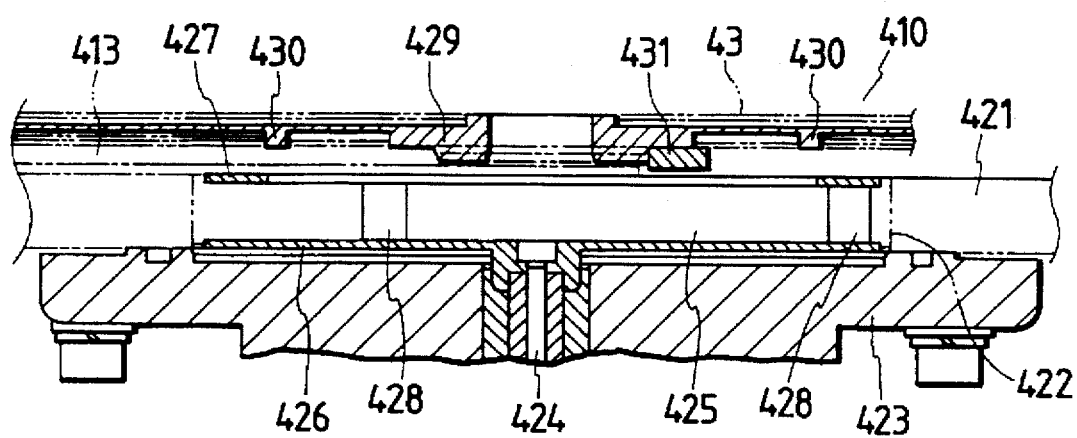
FIG. 12 is a sectional front view of a part of a load lock chamber in FIG. 7.

The delivery of a disk 43 in a load lock chamber 410 with respect to a carrying arm 413 will be described below with reference to FIGS. 11 and 12.

Reference numeral 421 designates a bottom plate of a load lock chamber 410; 422, a circular lack portion formed in the bottom plate 421; 423, a bottom body with which the lack portion 422 is covered airtightly from the lower portion of the lack portion 422; 424, an up/down shaft provided in the bottom body 423 so as to be up/down movable; 425, a support fixed to an upper end of the up/down shaft 424; 426, a circular lower plate of the support 425; 427, a C-shaped upper frame; 428, three support rods between the lower plate 426 and the upper frame 427; 429, a disk-like deposition preventing plate on which a disk 43 is placed; and 430, a projection provided at the lower surface of the deposition preventing plate 429 so as to project and fitted into the inside of the upper frame 427 so that the deposition preventing plate 429 is placed in position.

Reference numeral 431 designates a C-shaped receptor formed at a forward end of a carrying arm 413; and 432, a through-hole formed through the deposition preventing plate 429 at its center portion.

At the time of setting a disk 43, the up/down shaft 424 is moved up in the condition in which the cover 419 is closed, so that the upper surface of the lower plate 426 of the support 425 is made even in height to the upper surface of the bottom plate 421. Then, the deposition preventing plate 429 on which the disk 43 is mounted is put on the upper frame 427. After the arm returns to the film forming chamber, the cover is opened and the disk is replaced.

Then, the cover 419 is closed, vacuum exhaustion is performed, the gate valve 411 is opened, the carrying arm 413 is moved into the load lock chamber 410, and the receptor 431 of the arm 413 is moved to the lower portion of the upper frame 427 through a portion between adjacent support rods 428. At this time, the arm 413 is located in the lack portion of the C-shaped upper frame 427. Then, the up/down shaft 424 is moved down, the deposition preventing plate 429 is mounted on the receptor 431, and the arm 413 is moved into the film forming chamber 41.

Next, at the time of taking out the disk 43 after subjected to film formation, the arm 413 is moved onto the support 425 in the condition in which the up/down shaft 424 moves down, the up/down shaft 424 is moved up, the deposition preventing plate 429 on the receptor 431 is mounted on the upper frame 427, the arm 413 is returned into the film forming chamber 41, the gate valve 411 is closed, the cover 419 is opened, and the disk 43 after subjected to film formation is taken out.

Although the above-mentioned embodiment shows the case where four load lock chambers 410 are provided, it is sufficient to provide at least two chambers according to the present invention.

Having such a configuration as described above, the first embodiment of the present invention has effects as follows.

In the film forming apparatus according to the first embodiment of the present invention, the plurality of load lock chambers 410 are provided on the film forming chamber 41 through the respective gate valves 411 and the pivots 412 and the carrying arms 413 are provided in the film forming chamber 41 correspondingly to the respective load lock chambers 410. Accordingly, each of the load lock chambers 410 has no pivot so that the volume of each of the load lock chambers 410 can be reduced, the time required for vacuum exhaustion of the load lock chambers 410 can be shortened, and the quantity of treatment per unit time can be increased. Furthermore, in the duration of film formation, the gate valve 411 of each of the load lock chambers 410 can be kept closed, so that the film deposition onto seal surfaces of the gate valves 411 and inner surfaces of the load lock chambers 410 can be prevented.

Figure 13:
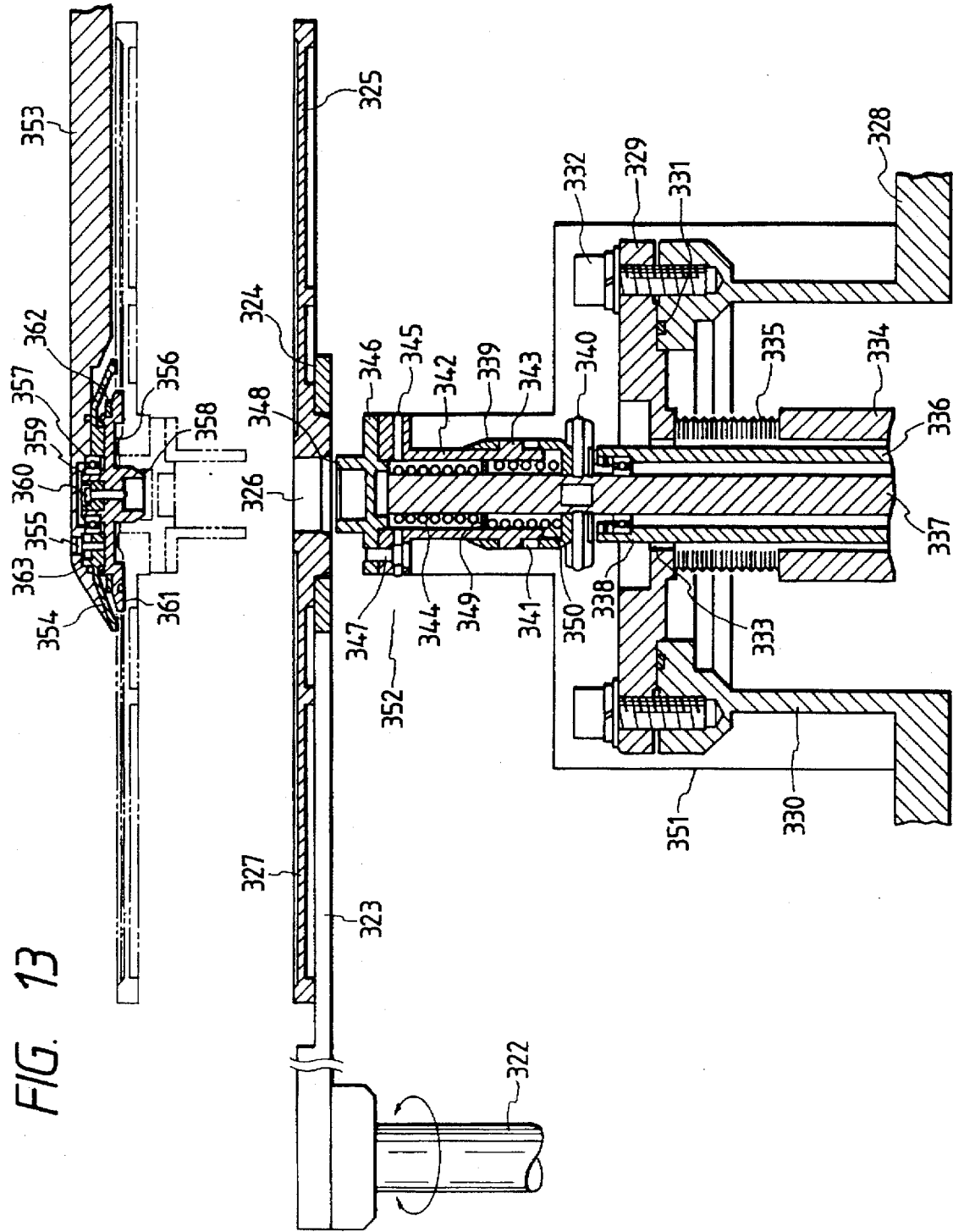
FIG. 13 is a partially separated sectional front view showing a second embodiment of the present invention.
Figure 14:
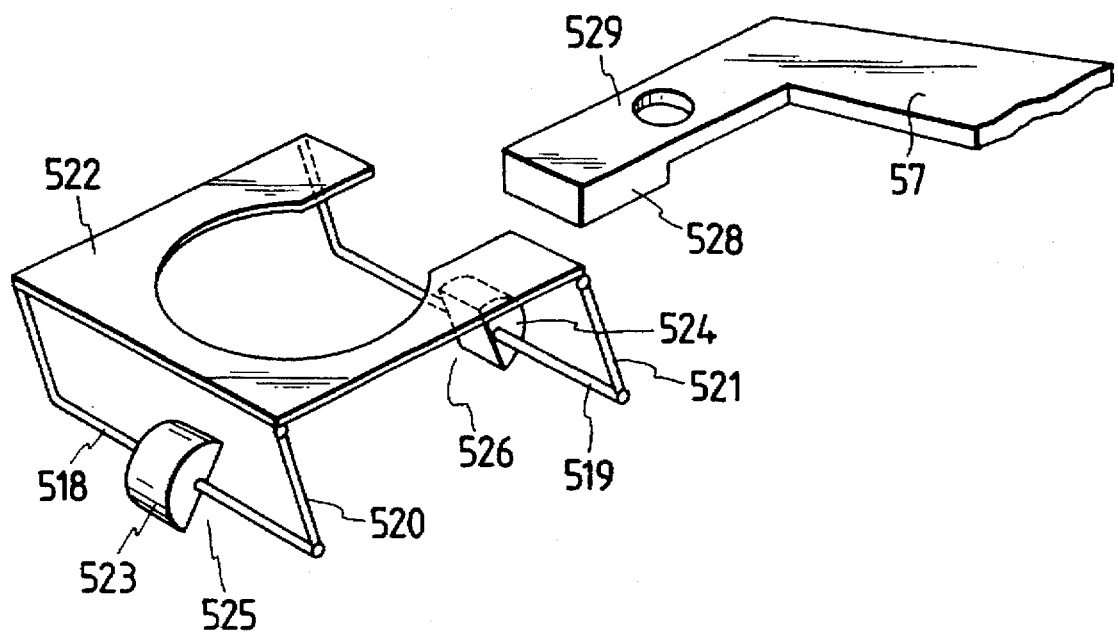
FIG. 14 is a persective view of a part of a third embodiment of the present invention.
Figure 15:
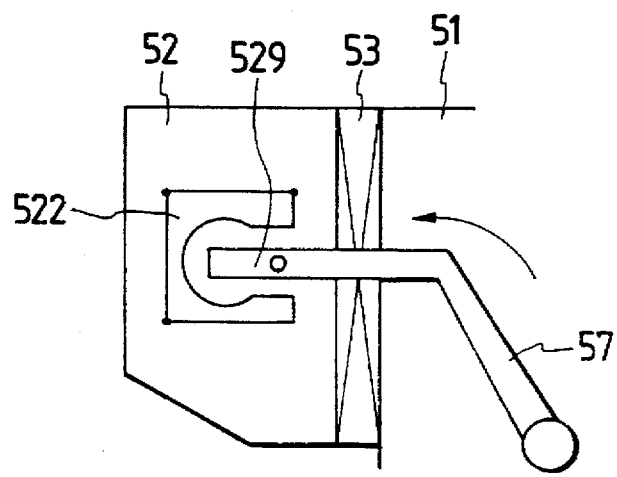
FIG. 15 is a plan view of FIG. 14.
Figure 16:
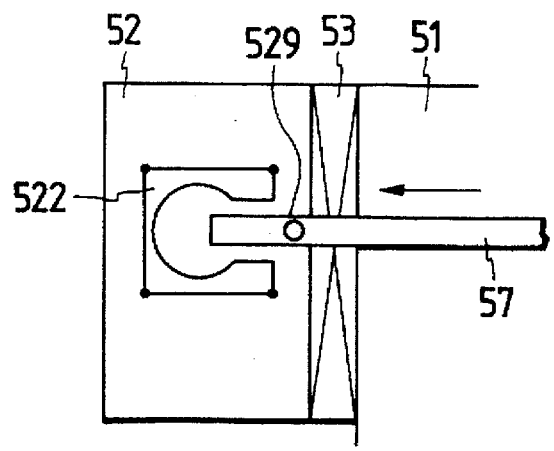
FIG. 16 is a plan view of FIG. 14 at the time of straight movement of a carrying arm.

Next, a second embodiment of the present invention will be described with reference to FIG. 13. In the drawing, reference numeral 322 designates a drive shaft; 323, a carrying arm formed on an upper end of the driving shaft 322 integrally therewith so as to extend in the horizontal direction; 324, a receptor provided on an end of the arm 323 so as to be C-shaped in plan; 325, a deposition preventing plate mounted on the receptor 324; 326, a through hole formed through a central portion of the deposition preventing plate 325; and 327, a disk (substrate) mounted on the deposition preventing plate 325.

Reference numeral 328 designates a base stand; 329, a cover plate abutting on an upper end of a cylindrical portion 330 of the base stand 328 through an O-ring 331; 332, bolts for fixing the cover plate 329 onto the cylindrical portion 330; 333, a through hole formed through a central portion of the cover plate 329; 334, a hollow main shaft provided in the cylindrical portion 330 so as to be movable up/down; 335, up/down moving bellows provided between an upper end portion of the main shaft 334 and a fringe portion of the through hole 333 in the lower surface of the cover plate 329; 336, a hollow pivot provided in the inside of the main shaft 334 and fixed at its lower end portion on the main shaft 334; and 337, a rotating shaft rotatably supported on the pivot 336 through a bearing 338 so as to move up/down integrally with the main shaft 334 and the pivot 336.

Reference numeral 339 designates an outer cylinder fixed on an upper portion of the rotating shaft 337 through screws 340; 341, a plurality of longitudinally elongated through holes provided in the outer cylinder 340; 342, an inner cylinder provided in the inside of the outer cylinder 339 so as to be movable up/down; and 343, projection portions projectingly provided on an outer surface of the inner cylinder 342 and inserted into the elongated holes 341 respectively.

Reference numeral 344 designates a ball bearing provided between an upper portion of the inner cylinder 342 and the rotating shaft 337; 345, screws for supporting the ball bearing 344; 346, a holder fixed on the upper end surface of the inner cylinder 342 through a screw 347 and having an inner diameter smaller than that of the receptor 324; and 348, an annular body projectingly provided on the upper surface of the holder 346 so as to be inserted into the through hole 326 of the deposition preventing plate 325.

Reference numeral 349 designates a spacer provided on a lower end of the ball bearing 344; and 350, a spring provided between the spacer 349 and the bottom surface of the outer cylinder 339 for urging the holder 346 upward through the spacer 349, the ball bearing 344, and the inner cylinder 342.

Reference numeral 351 designates a cover for covering the cylindrical portion 330 of the base stand 328, the outer cylinder 339, the inner cylinder 342, and the like. A push-up means 352 is constituted by the main shaft 334, the pivot 336, the rotating shaft 337, the outer cylinder 339, the inner cylinder 342, the holder 346, the spring 350, and the like.

Reference numeral 353 designates a support rod; 354, a mask fixed on an end of the support rod 353 through a screw 355; 356, a support provided under the mask 354 through a bearing 357; 358, an annular projection portion projectingly provided on the lower surface of the support 356; 359, a holding tool fixed on the support 356 by means of a screw 360 for preventing the support 356 from coming off from the bearing 357; 361, a disk pressing ring made of an insulating material such as Teflon or the like and provided on a peripheral portion of the support 356; 362, a stop ring for fixing the ring 361 onto the support 356; and 363, a cooling water path passed through the supporting rod 353 so as to be provided on the upper surface of the mask 354.

Next, the operation will be described. The disk 327 is mounted on the deposition preventing plate 325 provided on the receptor 324 of the carrying arm 323 in a load lock chamber, the drive shaft 322 is rotated to thereby carry the disk 327 into the position just under the film forming position, and the rotating shaft 37 is pushed up, so that the annular body 348 of the holder 346 on the upper end of the rotating shaft 337 is inserted into the through hole 326 in the deposition preventing plate 325, the deposition preventing plate 325 is separated from the receptor 324, the annular projection portion 358 of the support 356 is inserted into the inside of the annular body 348, and the upper surface of the disk 327 abuts on the support 356.

At this time, position displacement is absorbed by the annular body 348 and a taper formed in the annular portion 358 so that the fixed position is obtained, and shock between the holder 346 and the support 356 is lessened by means of the spring 350.

Next, the drive shaft 22 reversely rotates, the C-shaped receptor 324 is separated at its opening portion from the portion of the rotating shaft 337, and the disk 327 is subjected to film formation by rotation of the rotating shaft 337. At this time, the film deposition to the mechanism portions and overheat are prevented by means of the mask 354.

Having such a configuration as described above, the second embodiment of the present invention has effects as follows.

In the thus configured disk holding device of a film forming chamber of a film forming apparatus according to the second embodiment, the deposition preventing plate 325 is removably supported on an end of the carrying arm 323, a disk 327 mounted on the deposition preventing plate 325 is pushed up by the push-up means 352 together with the deposition preventing plate 325, the thus pushed-up deposition preventing plate 325 and the disk 327 are sandwiched between the rotatable push-up means 352 and the support 356. Accordingly:

(1) The configuration of the rotary shaft for the carrying arm 323 can be simplified because it is sufficient to use one shaft as the rotary shaft.

(2) The carrying arm 323 is made thin because it supports only the disk 327, and the opening of the gate valve of the load lock chamber and the volume of the load lock chamber can be made small so that the vacuum exhaust time can be shortened.

(3) The deposition preventing plate 325 is removable from the carrying arm 323, so that the maintenance of the deposition preventing plate 325 can be easily performed.

(4) Further, an upper surface of a disk 327 can be uniformly pressed by means of the support 356, so that the disk 327 can be prevented from being broken.

(5) Moreover, even when the number of the carrying arms 323 increases, it is sufficient to use only one push-up means 352 for rotating a disk 327.

Figure 4:
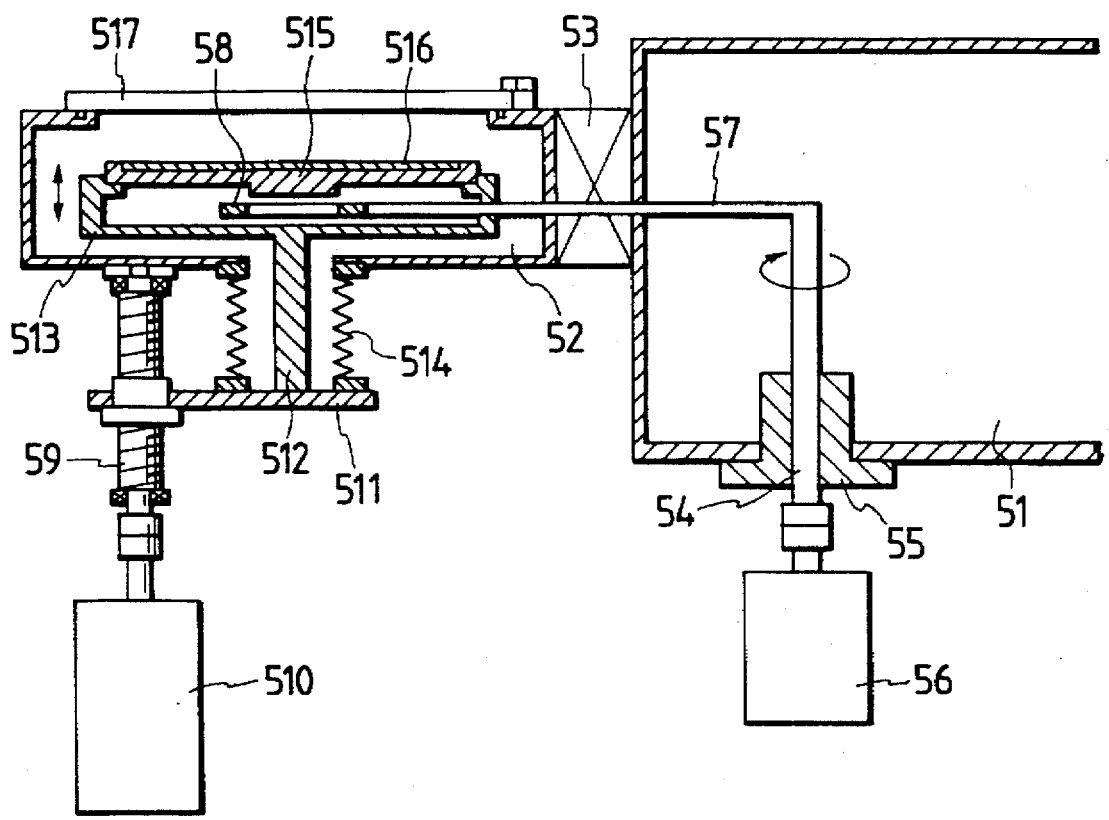
FIG. 4 is a sectional front view of another conventional apparatus.

A third embodiment will be described below with reference to FIGS. 14 through 19. In the drawings, the same reference numerals as those in FIG. 4 represent the same or corresponding parts.

Reference numerals 518 and 519 designate front and rear shafts rotatably provided in a load lock chamber 52 so as to be in parallel in a horizontal plane; 520 and 521, front and rear links fixed to the front and rear shafts 518 and 519 respectively so as to be perpendicular to the shafts; 522, a mount of a tray 515 of a substrate 516 to be subjected to film formation, the mount 522 having its front and rear portions connected to respective top end portions of the two links 520 and 521 and being located in a horizontal plane; and 523 and 524, substantially semicircular front and rear rollers fixed to the two shafts 518 and 519 respectively and having lack portions 525 and 526 displaced from each other. The positions of the lack portions 525 and 526 are displaced by about 90 degrees from each other.

Reference numeral 527 designates a holder projectingly provided in a bottom plate at the rear side of the rear shaft 519. When the mount 522 begins to move back from the uppermost position, the rear link 521 comes in contact with the holder 527 to thereby hold the mount 522 in an upper position. Reference numeral 528 designates an engagement body which is projectingly provided on a lower surface at the forward end of a carrying arm 57 so as to suitably engage with the two rollers 523 and 524 to thereby rotate the two rollers 523 and 524; and 529, a tray support portion at the forward end portion of the arm 57.

Figure 19:
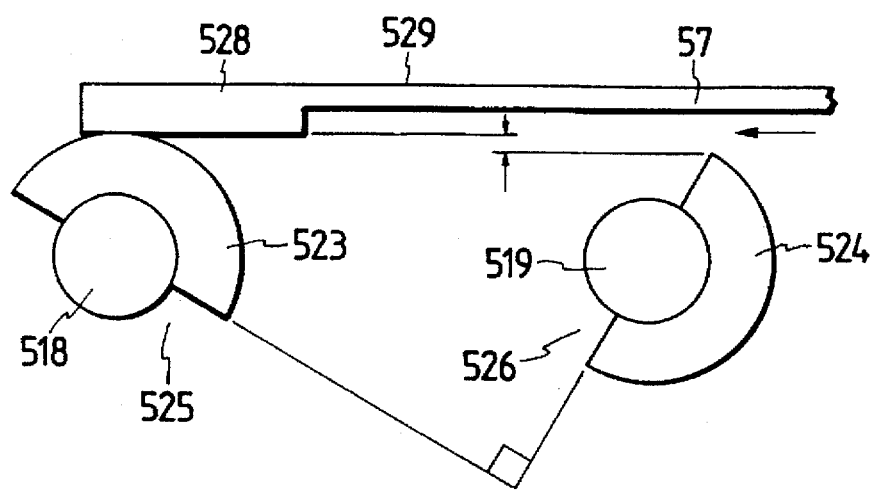
FIG. 19 is an enlarged front view of a part of FIG. 14.
Figure 17A:
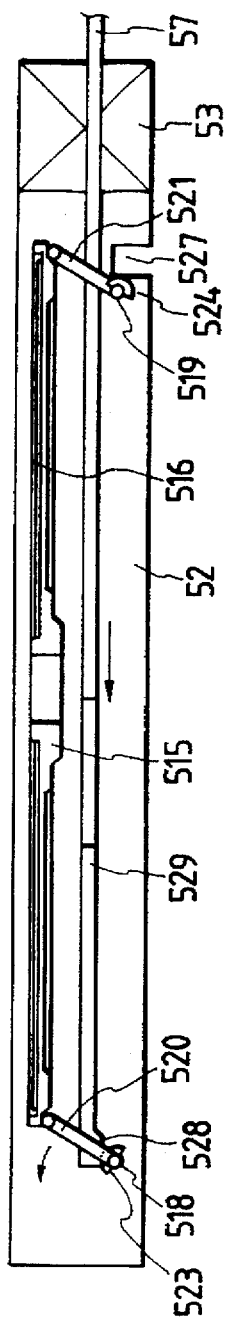
FIGS. 17A to 17D are views for explaning the operation of a front half of FIG. 14.

The operation of the above-mentioned embodiment will be described below. As shown in FIG. 17A, in the condition in which the rear link 521 abuts on the holder 527 so that the mount 522 is located in an upper portion, the substrate 516 together with the tray 515 is mounted on the mount 522, a cover is closed, and vacuum exhaustion is performed. In this condition, the two rollers 523 and 524 are located in slightly upper and lower positions respectively as shown in FIG. 19. That is, the lack portion 526 is located at the uppermost portion of the rear roller 524, so that the rear roller 524 is lower than the front roller 523.

Figure 17B:
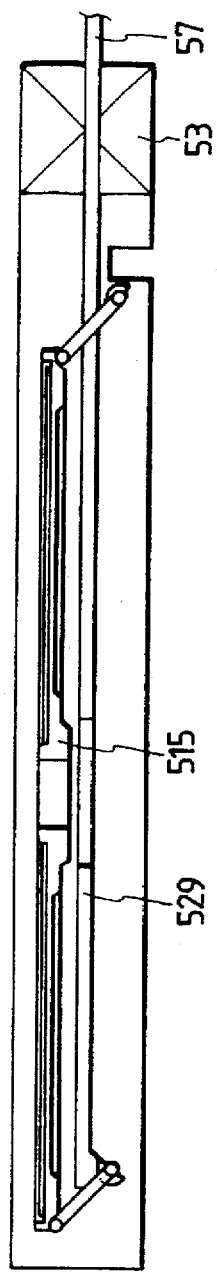
Figure 17C:
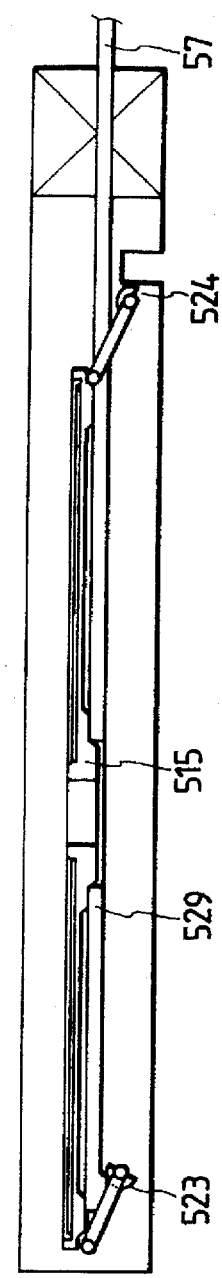
Figure 17D:
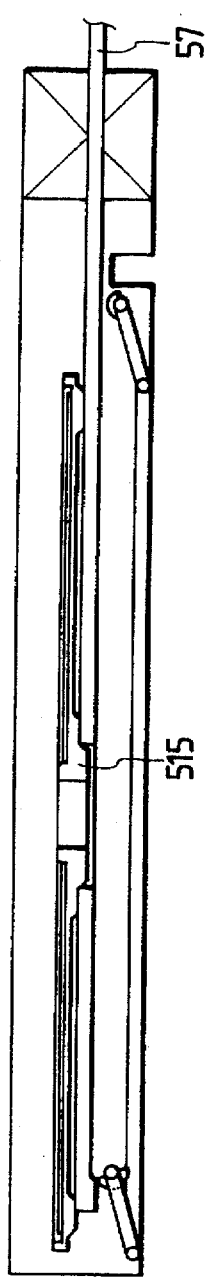

When the carrying arm 57 moves ahead into the load lock chamber 52 through a gate valve 53, the engagement body 528 at the forward end of the arm 57 does not engage with the rear roller 524 but engages with the front roller 523 to rotate left the link mechanism through the front shaft 518 and the front link 520 as shown in FIG. 17B. As a result, a projection at the center portion of the tray 515 is fitted into a hollow portion of the support portion 529 as shown in FIG. 17C, so that the tray 515 and the substrate 516 are mounted on the support 529. At the same time, the engagement between the engagement body 528 and the front roller 523 is released so that the link mechanism is rotated left by the gravity and strikes the bottom surface of the load lock chamber 52 as shown in FIG. 17D.

In this condition, the lack portion 525 is located at the uppermost portion of the front roller 523 so that the front roller 523 is in a lower position, while the rear roller 54 is in an upper position.

When the carrying arm 57 then moves back, the engagement body 528 does not engage with the front roller 523 but engages with the rear roller 524 as shown in FIG. 18A to rotate right the link mechanism through the rear shaft 519 and the rear link 521 as shown in FIG. 18B. When the engagement between the engagement body 528 and the rear roller 524 is then released, the rear link 521 is located in the rear of the rear shaft 519. As a result, the link mechanism is rotated right by the gravity and strikes the holder 527 as shown in FIG. 18C, so that the link mechanism returns to its original state.

Then, the gate valve 53 is closed, the cover of the load lock chamber 52 is opened, and a next tray 515 and a next substrate 516 are mounted on the mount 522.

Figure 20:
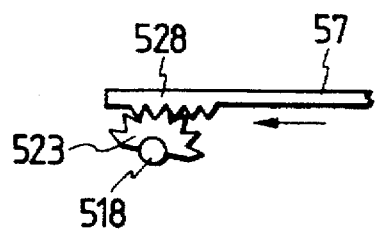
FIG. 20 is a front view of a part of modified embodiment of FIG. 14.

The means for engagement of the engagement body 528 with the rollers 523 and 524 is preferably provided in the form of engagement between a rack and a pinion as shown in FIG. 20.

Because the third embodiment of the present invention is configured as described above, the following effects are attained.

In the apparatus for delivering a substrate to be subjected to film formation according to the third embodiment of the present invention, the mount 522 of the tray 515 of the substrate 516 to be subjected to film formation is supported by a link mechanism, and the engagement body 528 of the carrying arm 57 engages with the substantially semicircular front and rear rollers 523 and 524 which are provided in the front and rear of the link mechanism respectively and have the lack portions 525 and 526 displaced from each other. Thus, when the tray support portion 529 at the forward end portion of the carrying arm 57 moves ahead into the link mechanism, the engagement body 528 engages with the front roller 523, and the mount 522 at an upper position moves down to thereby mount the tray 515 on the support portion 529. When the support portion 529 contrariwise moves back, the engagement body 528 engages with the rear roller 524 and the mount 522 moves up to thereby make it possible to return the mount 522 to its original upper position. Accordingly, not only the drive source for up/down moving the mount as required in the conventional apparatus is unnecessary but control in linking such up/down moving means is unnecessary. Accordingly, the apparatus can be simplified in configuration and can be reduced in cost. Further, the surface area of the load lock chamber can be reduced without use of bellows, so that vacuum exhausting time up to a high vacuum region can be shortened. Furthermore, there is no airtight portion related to the up/down moving operation, so that maintenance can be made unnecessary.

A fourth embodiment of the present invention will be described with reference to FIGS. 21 through 24. Reference numeral 616 designates a cylinder uprightly provided below the film forming position; 617, a bearing provided on the inner surface of an upper end of the cylinder 616; and 618, a ring-shaped abutting body rotatably supported by the bearing 617.

Reference numeral 619 designates a rotating shaft up/down movably provided in a central portion of the cylinder 616 and having a cylindrical upper portion; 620, three pivots formed in the inside of the upper portion of the rotating shaft 619; 621, lead-out holes formed through a portion of the rotating shaft 619 below the pivots 620 respectively; 622, L-shaped opening/closing rods rotatably supported at their base portions by the respective pivots 620; 623, lower rods of the opening/closing rods 622 led out of the respective lead-put holes 621 so that their forward end portions are disposed below the abutting body 618; 624, vertical rods of the opening/closing rods 622 with their upper ends slightly led out of the upper end of the rotating shaft 619; 625, upper rods extended outward from the upper ends of the respective vertical rods 624; 626, springs bridged across the vertical rods 624 for pulling the vertical rods toward the central portion of the rotating shaft 619 to thereby make the upper rods 625 into the contracted-closed state.

Figure 24:
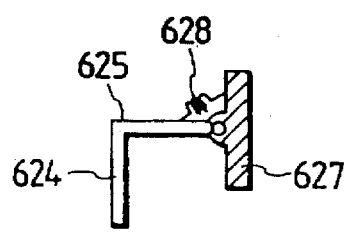
FIG. 24 is an enlarged view showing a part of FIG. 22.

Reference numeral 627 designates pressing bodies rotatably supported on the ends of the respective upper rods 625; and 628, springs for holding the respective pressing bodies 627 perpendicularly to the respective upper rods 625. In the state of FIG. 24, the pressing bodies 627 cannot rotate left from their illustrated position but can rotate right by about 90 degrees.

Reference numeral 629 designates a disk-like main cover uprightly provided on the upper end of the rotating shaft 619 and having substantially the same diameter as that of the rotating shaft 619; and 630, fan-shaped auxiliary covers fixed on the respective upper rods 625 so as to extend outward from the lower portions of the main cover 629.

Next, the operation of this embodiment will be described. When the rotating shaft 619 is located in the descending position, as shown in FIG. 22, the upper rods 625 are located in the contracted-closed position through the vertical rods 624 by means of the springs 626, and the pressing bodies 627 and the auxiliary covers 630 are not projected from the circumferential surface of the rotation shaft 619 but located just under the main cover 629, so that the lower rods 623 are positioned in a substantially horizontal plane.

Figure 21:
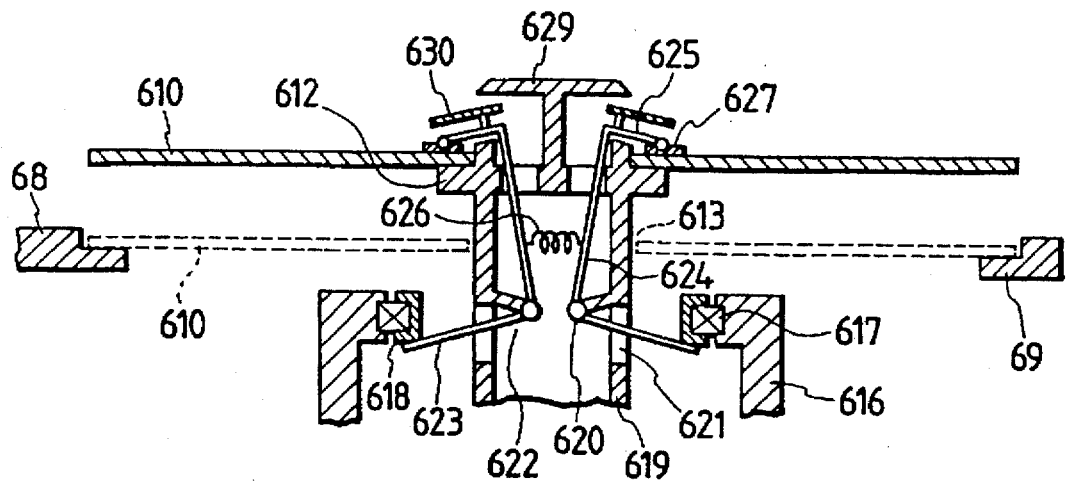
FIG. 21 is a sectional front view showing a fourth embodiment of the present invention.
Figure 22:
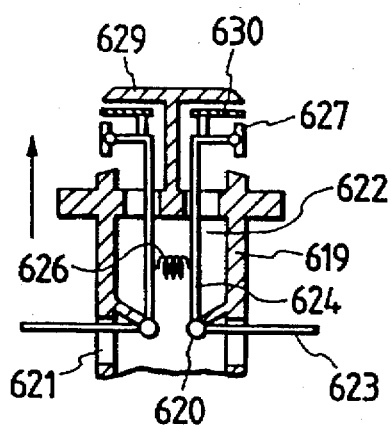
FIG. 22 is a sectional front view showing a part of FIG. 21 in another state.
Figure 23:
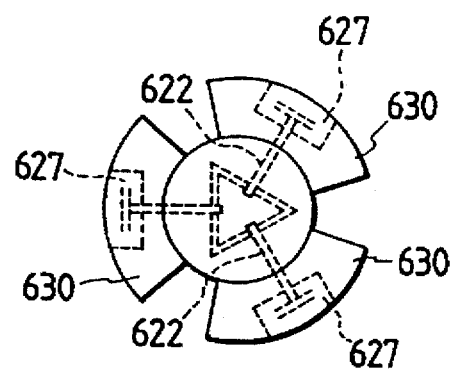
FIG. 23 is a plan view showing a part of FIG. 21.

When the disk (substrate) 610 is carried to the film forming position by forward rotation of the carrying arm 68, the rotating shaft 619 in the state of FIG. 22 ascends, the upper end of the rotating shaft 619 is fitted into the central hole 613 of the disk 610, and the disk 610 is mounted on the receptor 612. When the rotating shaft 619 further ascends, the respective forward end portions of the lower rods 623 abut on the abutting body 618, the respective opening/closing rods 622 swing about the pivots 620 against the springs 626, and the upper rods 625 and auxiliary covers 630 open to extend as shown in FIG. 21. At this time, the respective lower edges of the pressing bodies 627 abut on the upper surface of the rim portion of the central hole 613 of the disk 610, and the respective pressing bodies 627 swing against the springs 628, so that the disk 610 is sandwiched between the pressing bodies 627 and the receptor 612.

Then, the rotating shaft 619 is rotated by the reverse rotation of the carrying arm 68, thereby performing the film formation.

After completion of the film formation, the rotating shaft 619 descends, the lower rods 623 are separated from the abutting body 618, and the opening/closing rods 622 and the pressing bodies 627 are contracted-closed by the springs 626 and 628 to be in such a state as shown in FIG. 22, so that the disk 610 is mounted on the support portion 69 of the carrying arm 68.

Although the case of three opening/closing rods 622 and three pressing bodies 627 has been described in the above embodiment, the number of those members is not limited to this.

Having such a configuration as described above, the fourth embodiment of the present invention has effects as follows.

In the disk (substrate) supporting device of a film forming apparatus according to the fourth embodiment of the present invention, the pressing bodies 627 for pressing the upper surface of the rim portion of the central hole 613 of a disk 610 mounted on the receptor 612 of the rotating shaft 619 are provided on the upper end of the rotating shaft 619 so as to be capable of being expanded-opened and contracted-closed. Therefore, differing from the conventional device, the support arms for supporting the respective pressing bodies do not exist at the film forming surface side of the disk 610, there is nothing to prevent film formation on the disk 610, and there are no reduction in the rate of film formation as well as no irregularity in film thickness distribution. Further, differing from the conventional device, there occurs no falling down of films peeling off from the support arms of the pressing bodies onto a film forming surface of the disk 610 and there is no abrasion portions due to conventional positioning. Thus, it is possible to prevent bad influence onto the quality and thickness distribution of the film from occurring.

Figure 25:
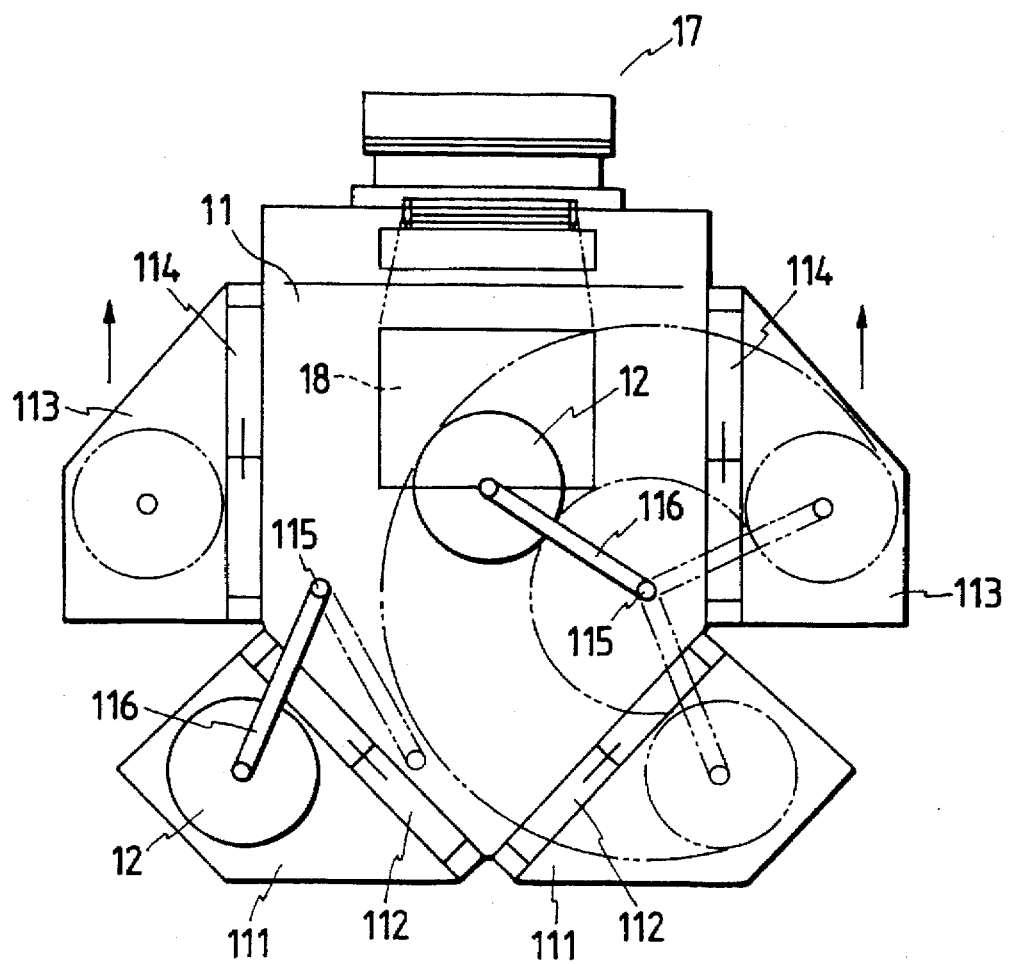
FIG. 25 is a schematic plan view showing a fifth embodiment of the present invention.
Figure 26:
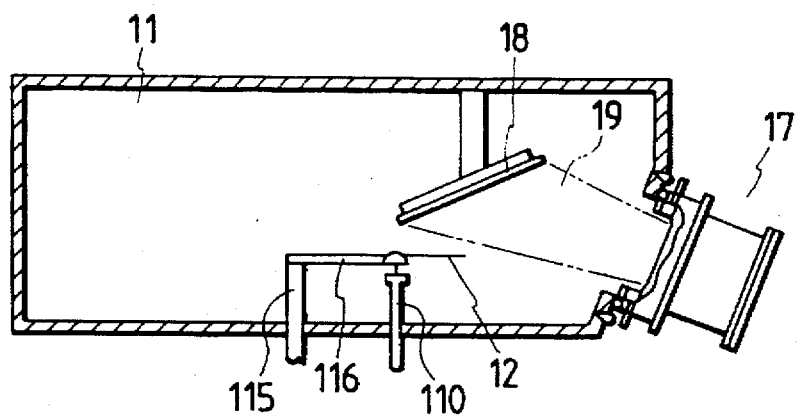
FIG. 26 is a sectional side view of FIG. 25.
Figure 27:
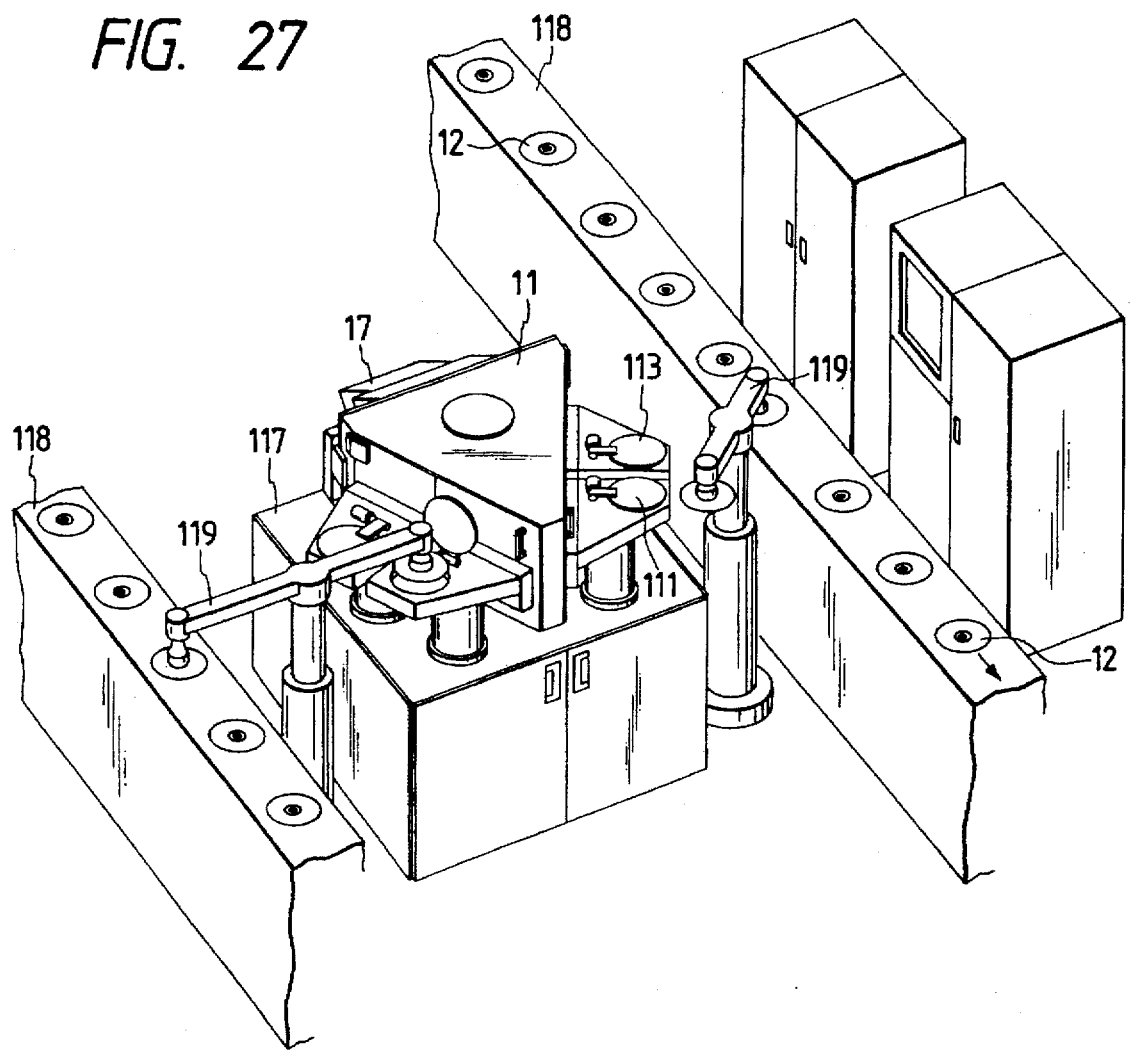
FIG. 27 is a persective view showing the whole configuration of the fifthe embodiment.

A fifth embodiment of the present invention will be described with reference to FIGS. 25 through 27. Reference numeral 111 designates a take-in chamber provided on a one-side front portion of a film forming chamber 11 through a square gate valve 112 for exclusively taking in a disk (substrate) 12; 113, a take-out chamber provided on a one-side rear portion of the film forming chamber 11 through a square gate valve 114 for exclusively taking out a disk 12; 115, a pivot uprightly provided in the film forming chamber 11 on its one side; and 116, a carrying arm rotatably supported on the pivot 115 for supporting a disk 12 in the take-in chamber 111 before subjected to film formation, for carrying the supported disk 12 to the film forming position and for carrying the disk 12 after subjected to film formation into the take-out chamber 113. Another take-in chamber 111, another take-out chamber 113, another carrying arm 116, etc., are also provided on the other side of the film forming chamber 11 in the same manner as on the one side.

Reference numeral 117 designates a mount table of the film forming chamber 11; 118, carrying lines disposed on the opposite sides of the mount table 117 parallelly to each other so as to move; and 119, carrying robots which are provided between the mount table 117 and the one carrying line 18 and between the mount table 117 and the other carrying line 18 respectively so that each of the carrying robots 119 grasps a disk 12 before subjected to film formation disposed on the carrying line 118 to carry the disk 12 into the take-in chamber 111 and grasps another disk 12 after subjected to film formation disposed in the take-out chamber 113 to carry the disk 12 onto the carrying line 118.

One of the carrying robots 119 grasps a disk 12 before subjected to film formation disposed on the one carrying line 118 and sets the disk 12 into the one take-in chamber 111. After the one take-in chamber 111 has been exhausted into a vacuum state, the one gate valve 112 is opened, the disk 12 is carried into the film forming chamber 11 by means of the one carrying arm 116, the one gate valve 111 is closed, the disk 12 is grasped by the disk holder 110, and film formation onto the disk is performed at the film forming position. In this duration, the one take-in chamber 111 is leaked, a next disk 12 before subjected to film formation next is set, and the one take-in chamber 111 is exhausted into a vacuum state.

After completion of film formation, the disk 12 is grasped by means of the one carrying arm 116, the one gate valve 114 is opened, the disk 12 is set into the one take-out chamber 113 which is exhausted into a vacuum state, the one carrying arm 116 is returned into the one film forming chamber 11, the one gate valve 114 is closed, the one take-out chamber 113 is leaked, and the disk 12 is grasped by the one carrying robot 119 and carried onto the carrying line 118. Next, another disk 12 in the take-in chamber 111 is grasped by means of the one carrying arm 116 and the same operation as described above is repeated.

Disks 12 mounted on the other carrying line 118 are alternately carried into the film forming position so as to be subjected to film formation and the disk 12 are carried in the same operation as described above.

Assuming that it takes 6 seconds for taking a disk 12 into a closed vessel and it takes 6 seconds for taking the disk 2 out the closed vessel, an inner wall of the vessel is exposed to the atmosphere for 12 seconds in the conventional case. According to this embodiment, on the contrary, the time taken for each of the take-in and take-out chambers 111 and 113 to be exposed to the atmosphere is halved to 6 seconds.

Figure 28:
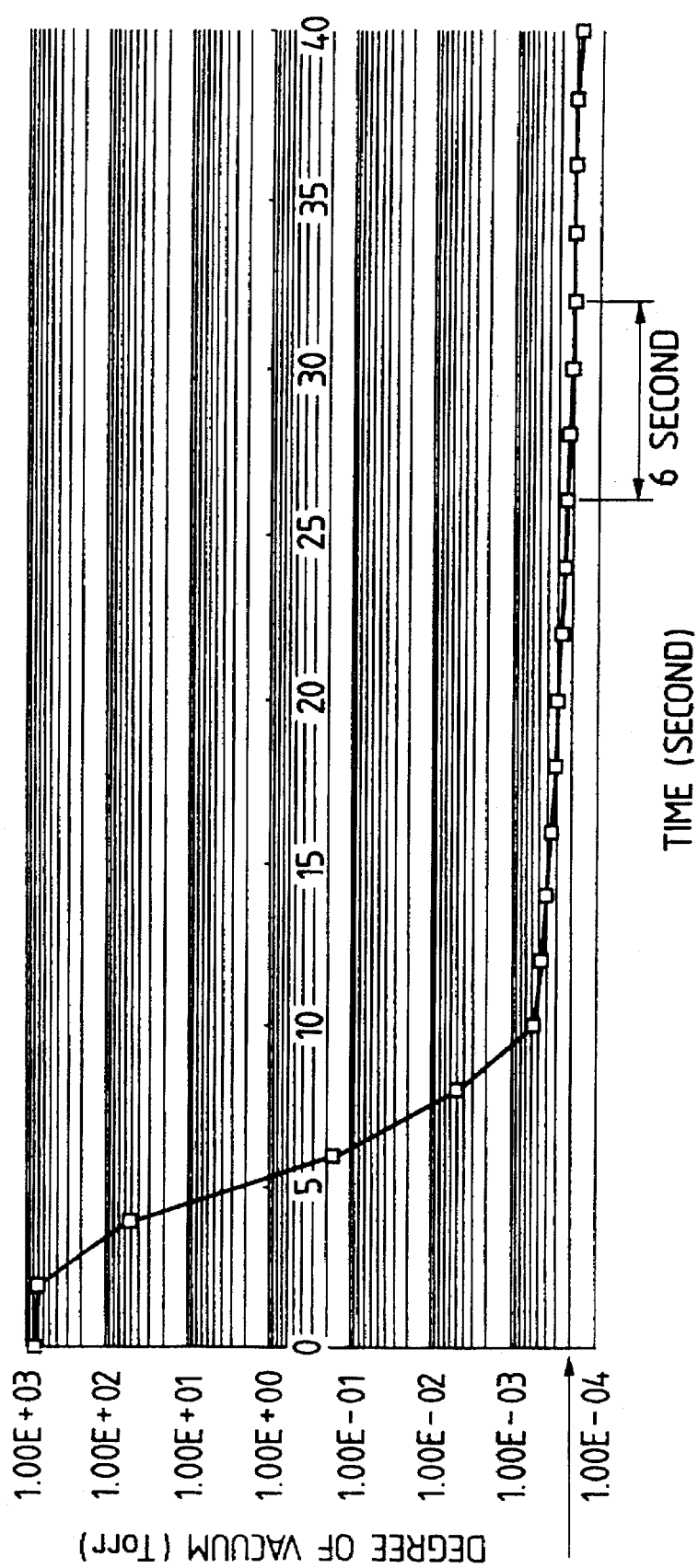
FIG. 28 is a view showing an exhaust charactersitic.

FIG. 28 shows the exhaust characteristics in the cases where a closed vessel having a volume of 3 liters is exposed to the atmosphere for 6 seconds (black squares) and for 12 seconds (white squares) respectively. It is found from the drawing that the exposure time to the air extremely affects the exhaust time. A difference in time taken for reaching a desired degree of vacuum of $2\times10^{-4}$ Torr between the above cases is about 6 seconds, and this time difference largely affects the quantity of treatment per unit time (throughput) in a machine of mass production.

Having such a configuration as described above, the fifth embodiment of the present invention has effects as follows.

In the thus configured film forming apparatus according to the fifth embodiment of the present invention, since the take-in chamber 111 for exclusively taking in a disk 12 before subjected to film formation and the take-out chamber 113 for exclusively taking out the disk 12 after subjected to film formation are provided separately from each other, the time for which the chambers 111 and 113 are exposed to the atmosphere is substantially halved in comparison with the conventional example so that the time for vacuum exhaustion is reduced to thereby increase the quantity of treatment per unit time. Further, the configuration of an outside disk carrying line is simplified because the disk take-in and take-out portions are separated from each other, and since a disk 12 is carried into the take-in chamber 111, the film forming chamber 11, and the take-out chamber 113 by means of only one carrying arm 116, the number of the arms is halved in comparison with the conventional example and the cost is reduced.

Figure 5:
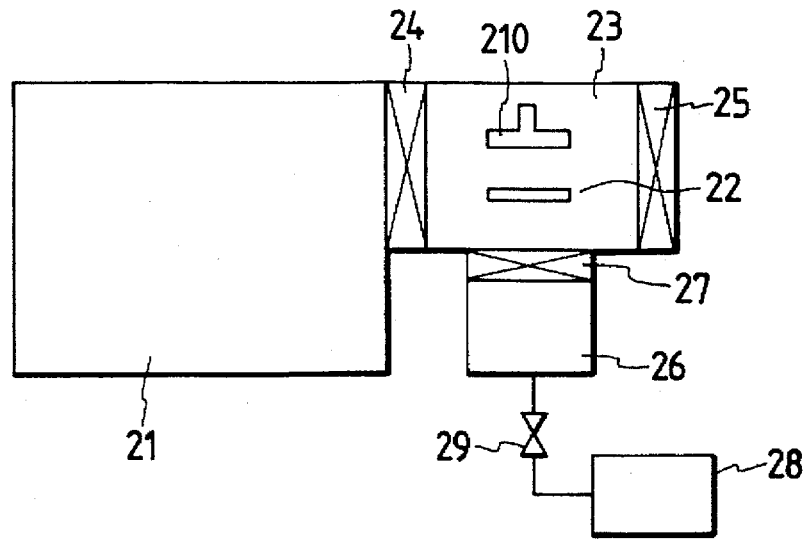
FIG. 5 is a schematic view showing another conventional apparatus.
Figure 6:
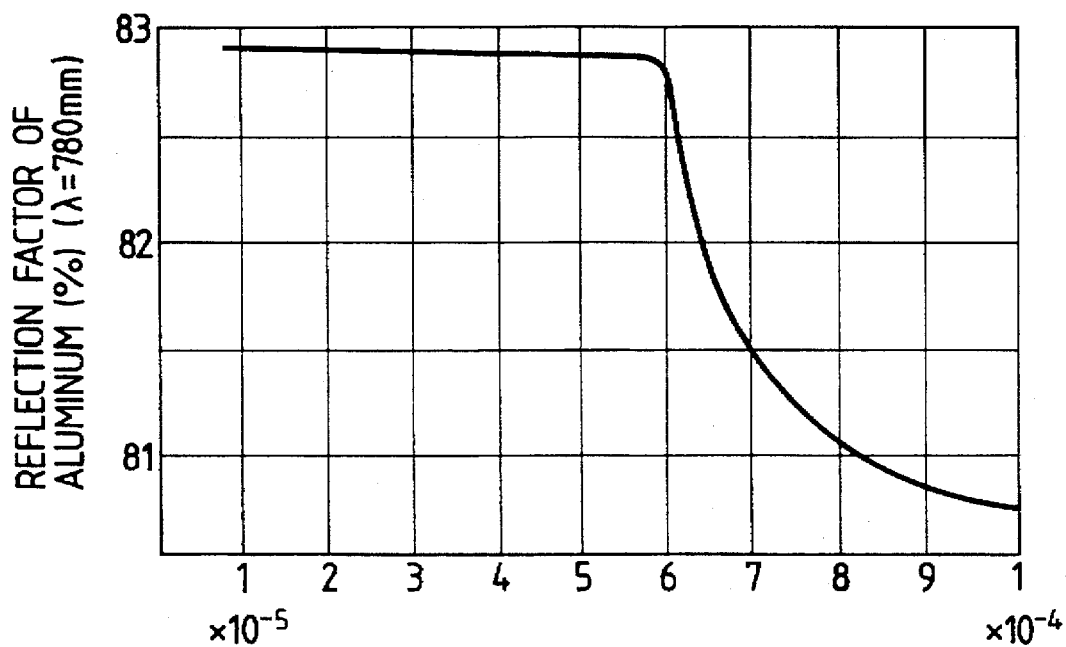
FIG. 6 is a view showing the relation between the degree of vacuum and a reflection factor of aluminum.
Figure 7:
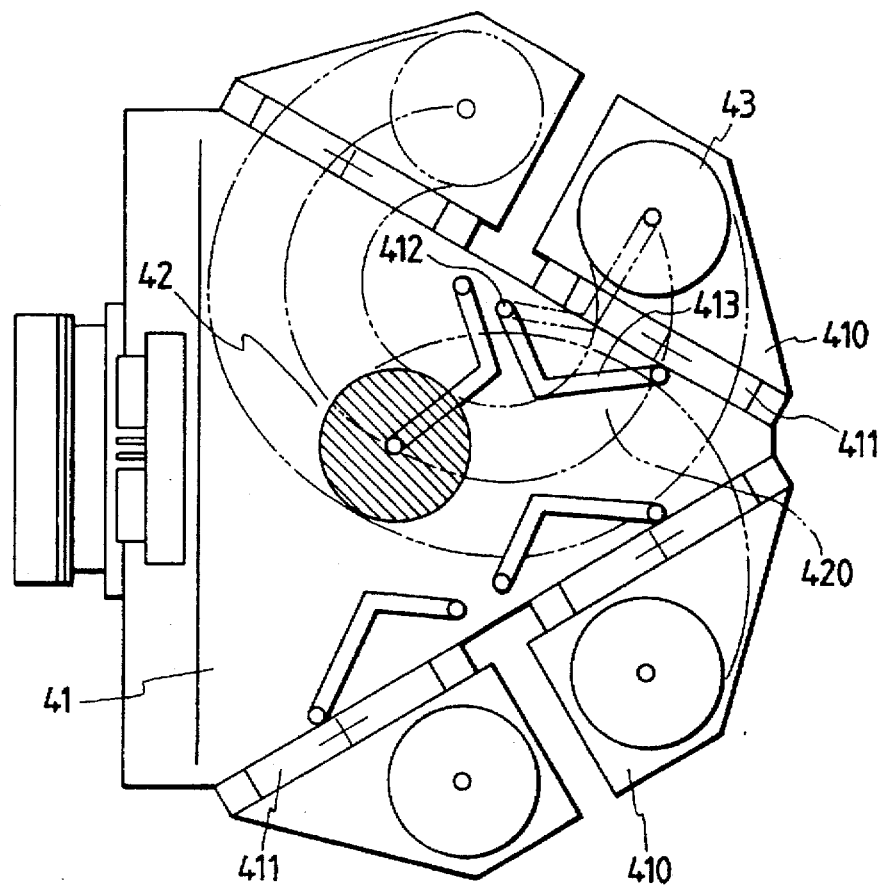
FIG. 7 is a schematic front view of a first embodiment of the present invention.
Figure 8:
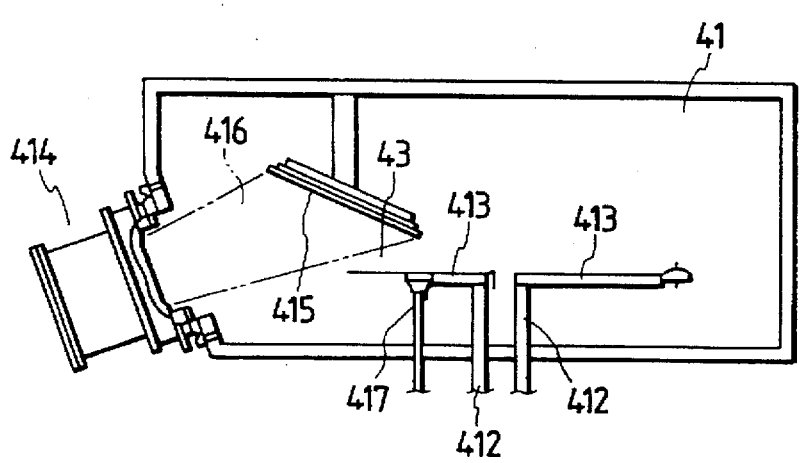
FIG. 8 is a sectional side view of a part of FIG. 7.
Figure 9:
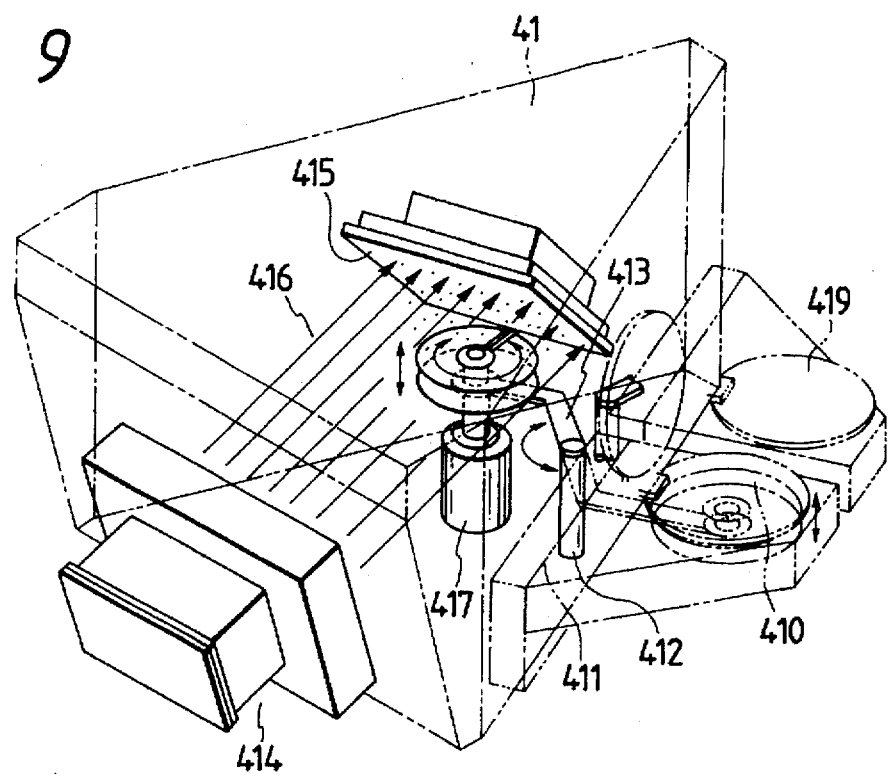
FIG. 9 is a perspective view of a part of FIG. 7.
Figure 10:
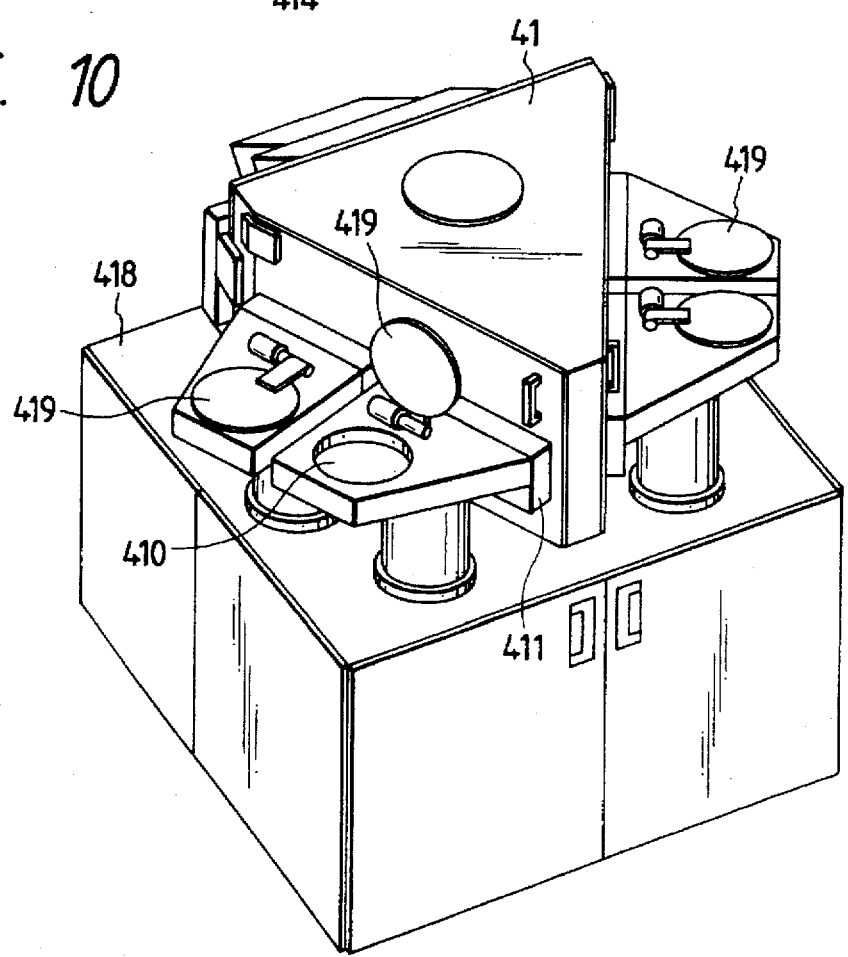
FIG. 10 is a perspective view of the whole of FIG. 7.
Figure 29:
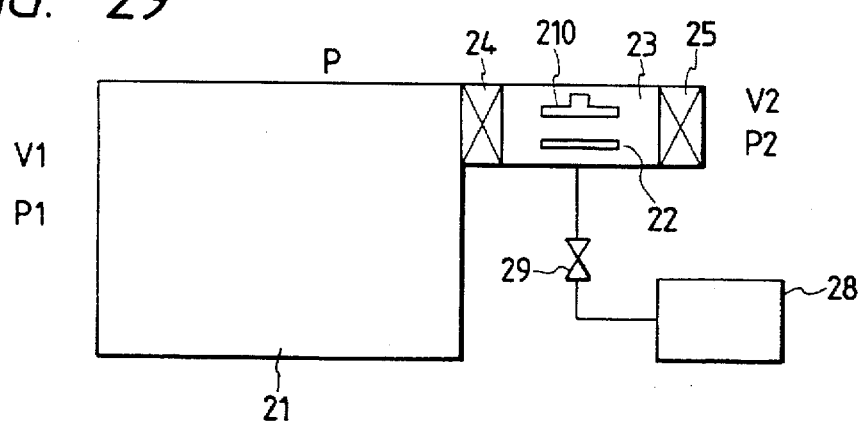
FIG. 29 is a schematic view showing a sixth embodiment of the present invention.

A sixth embodiment of the present invention will be described with reference to FIG. 29. In FIG. 29, the same reference numerals as those in FIG. 5 designate the same or corresponding portions. The apparatus of FIG. 29 is different from that of FIG. 5 in that the turbo molecular pump 26 of FIG. 5 is not provided but only the rotary pump 28 is used as the pump for exhausting the load lock chamber 23, and that the load lock chamber 23 is reduced in volume so as to have a proportion not larger than a predetermined value relative to the film forming chamber 21, in other words, the film forming chamber 21 is increased in volume so as to have a proportion not smaller than a predetermined value relative to the load lock chamber 23.

That is, now, when the volume of the film forming chamber 21 is V1, the reachable degree of vacuum in the film forming chamber 21 is P1, the required degree of vacuum in film formation, that is, immediately before subjected to film formation is P, the volume of the load lock chamber 23 is V2, and the reachable degree of vacuum in the load lock chamber 23 is P2, the following expression is established:

$$P1\times V1+P2\times V2=P\times(V1+V2).$$

Accordingly, $$V1/V2=(P2-P)/(P-P1).$$

Since it is necessary to obtain at least the required degree of vacuum P when the inside gate valve 24 is opened, the relation between the volumes V1 and V2 is selected so as to satisfy the following expression.

$$V1/V2 \geq (P2-P)/(P-P1)$$

Now, assuming that P1 is $1\times10^{-7}$ Torr, P2 is $1\times10^{-3}$ Torr, and P is $6\times10^{-5}$ Torr, then $V1/V2 \geq 15.69$. Accordingly, it is will do to select the value V1 to be not smaller than 15.7 times as much as V2 or to select the value V2 to be not larger than 0.064 times as much as V1.

Having such a configuration as described above, the sixth embodiment of the present invention has effects as follows.

In the film forming apparatus according to the sixth embodiment of the present invention, the relation in volume between the film forming chamber and the load lock chamber is limited by the reachable degrees of vacuum of both the chambers as well as the required degree of vacuum of the film forming chamber, and the volume of the film forming chamber is made to have a proportion which is larger than a predetermined value relative to the load lock chamber, or the volume of the load lock chamber is made to have a proportion which is smaller than a predetermined value relative to the film forming chamber. Accordingly it is not necessary to use any expensive turbo molecular pump or the like but only an inexpensive rotary pump may be used to exhaust the load lock chamber into vacuum state. Thus, the equipment cost can be reduced.

What is claimed is:

1. A film forming apparatus comprising a delivering device of a substrate to be subjected to film formation, said delivering device comprising:

a rotatable front shaft and a rotatable rear shaft which are provided in parallel in a horizontal plane;

a front link and a rear link which are fixed to said front and rear shafts so as to be perpendicular to said front and rear shafts, respectively;

a mount connected to respective top end portions of said front and rear links and located in a horizontal plane so as to mount thereon a tray of said substrate to be subjected to film formation;

a front roller and a rear roller which are substantially semicircular and fixed to said front and rear shafts respectively and which have lack portions displaced in position from each other;

a holder for holding said mount at a position above said front and rear shafts;

a carrying arm having a tray support portion provided at its forward end portion so that said tray support portion goes in and out of a position above said front and rear shafts; and an engagement body projectingly provided at a lower surface of a forward end of said carrying arm so as to engage with said front and rear rollers to thereby rotate said front and rear rollers.

* * * * *